United States Patent
Jain

(10) Patent No.: US 9,269,854 B2
(45) Date of Patent: Feb. 23, 2016

(54) METHODS OF FABRICATING OPTOELECTRONIC DEVICES USING LAYERS DETACHED FROM SEMICONDUCTOR DONORS AND DEVICES MADE THEREBY

(75) Inventor: Ajaykumar R. Jain, San Carlos, CA (US)

(73) Assignee: VerLASE Technologies LLC, Shelburne, VT (US)

( * ) Notice: Subject to any disclaimer, the term of this patent is extended or adjusted under 35 U.S.C. 154(b) by 12 days.

(21) Appl. No.: 13/816,798

(22) PCT Filed: Mar. 21, 2011

(86) PCT No.: PCT/US2011/029190
§ 371 (c)(1),
(2), (4) Date: Feb. 13, 2013

(87) PCT Pub. No.: WO2012/033551
PCT Pub. Date: Mar. 15, 2012

(65) Prior Publication Data
US 2013/0143336 A1    Jun. 6, 2013

Related U.S. Application Data

(60) Provisional application No. 61/403,041, filed on Sep. 10, 2010, provisional application No. 61/456,152, filed on Nov. 3, 2010.

(51) Int. Cl.
*H01L 33/00* (2010.01)
*H01L 33/06* (2010.01)
(Continued)

(52) U.S. Cl.
CPC .......... *H01L 33/005* (2013.01); *H01L 33/0079* (2013.01); *H01L 33/06* (2013.01);
(Continued)

(58) Field of Classification Search
None
See application file for complete search history.

(56) References Cited

U.S. PATENT DOCUMENTS 6,593,212 B1 *  7/2003  Kub et al. ................. 438/458
6,794,276 B2 *  9/2004  Letertre et al. ............ 438/506
(Continued)

FOREIGN PATENT DOCUMENTS

| CN | 101796627 A | 8/2010 |
|---|---|---|
| JP | S49115486 A | 11/1974 |

(Continued)

OTHER PUBLICATIONS

International Search Report dated Dec. 7, 2011, in connection with related PCT/US2011/029190 filed Mar. 21, 2011.
(Continued)

*Primary Examiner* — Scott B Geyer
(74) *Attorney, Agent, or Firm* — Downs Rachlin and Martin, PLLC

(57) ABSTRACT

Methods of making optoelectronic devices containing functional elements made from layers liberated from natural and/or fabricated lamellar semiconductor donors. In one embodiment, a donor is provided, a layer is detached from the donor, and the layer is incorporated into an optoelectronic device as a functional element thereof. The thickness of the detached layer is tuned as needed to suit the functionality of the functional element. Examples of functional elements that can be made using detached layers include p-n junctions, Schotkey junctions, PIN junctions, and confinement layers, among others. Examples of optoelectronic devices that can incorporate detached layers include LEDs, laser diodes, MOSFET transistors, and MISFET transistors, among others.

36 Claims, 16 Drawing Sheets

(51) Int. Cl.
*H01L 21/02* (2006.01)
*H01L 33/08* (2010.01)

(52) U.S. Cl.
CPC ..... *H01L21/02521* (2013.01); *H01L 21/02568* (2013.01); *H01L 33/0041* (2013.01); *H01L 33/08* (2013.01); *H01L 2924/0002* (2013.01)

(56) References Cited

U.S. PATENT DOCUMENTS

| | | | |
|---|---|---|---|
| 7,256,101 B2 * | 8/2007 | Letertre et al. | 438/458 |
| 7,687,372 B2 | 3/2010 | Jain | |
| 7,713,840 B2 * | 5/2010 | Kelly et al. | 438/458 |
| 9,035,344 B2 * | 5/2015 | Jain | 257/98 |
| 2007/0141803 A1 * | 6/2007 | Boussagol et al. | 438/455 |
| 2010/0216271 A1 | 8/2010 | Moon | |
| 2011/0095400 A1 | 4/2011 | Garnier | |

FOREIGN PATENT DOCUMENTS

| | | |
|---|---|---|
| JP | S61182280 A | 8/1986 |
| JP | 10056200 A | 2/1998 |
| JP | 11204888 A | 7/1999 |
| JP | 2004327719 A | 11/2004 |
| JP | 2008135418 A | 6/2008 |
| JP | 2009094144 A | 4/2009 |
| JP | 2010067903 A | 3/2010 |
| WO | 2005024934 A1 | 3/2005 |
| WO | 2007-071772 A1 | 6/2007 |
| WO | 2009/030662 A2 | 3/2009 |

OTHER PUBLICATIONS

Written Opinion dated Dec. 7, 2011, in connection with related PCT/US2011/029190 filed Mar. 21, 2011.

* cited by examiner

Bandgap versus thickness of the thin films

Quantum Well thickness in Angstrom (A)

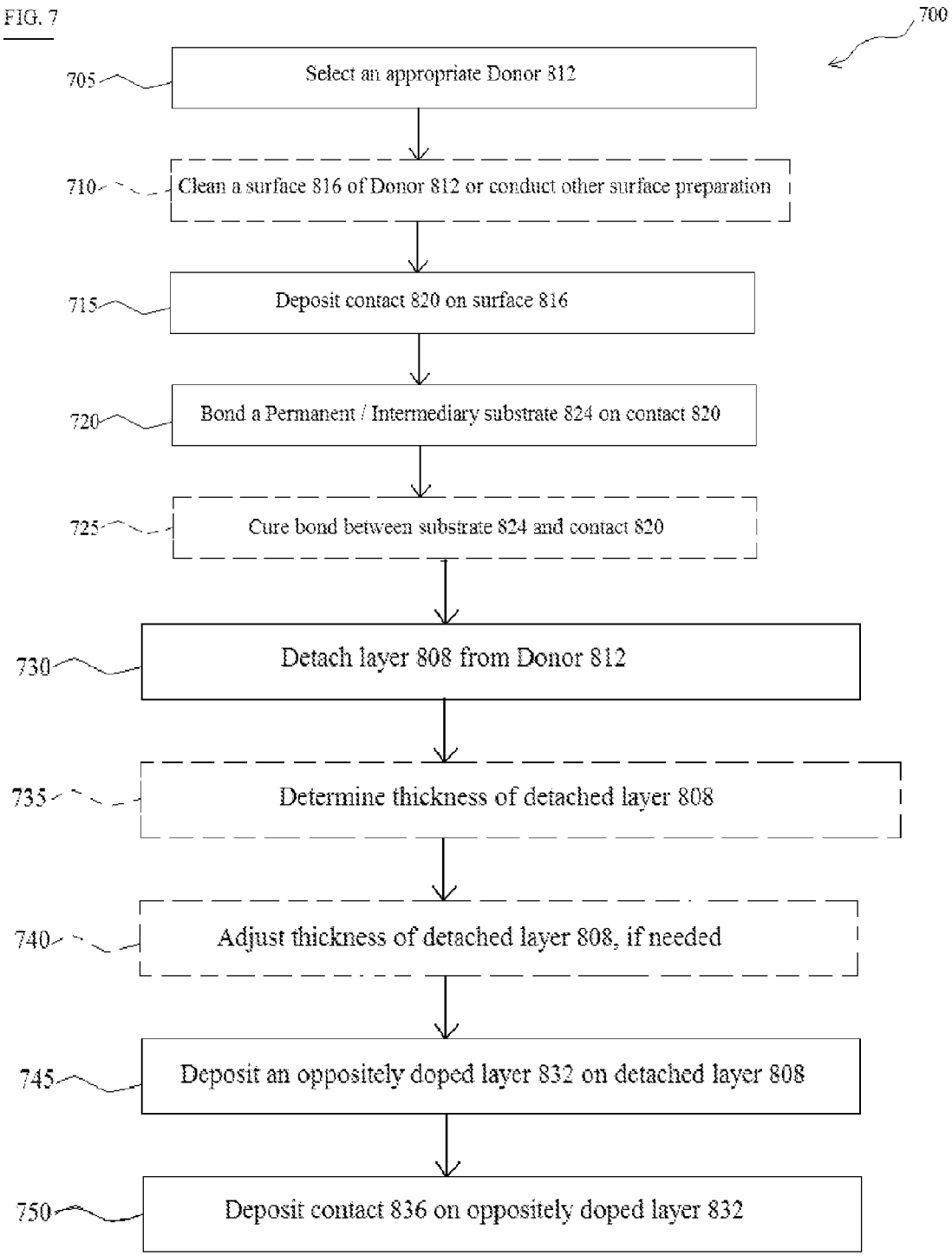

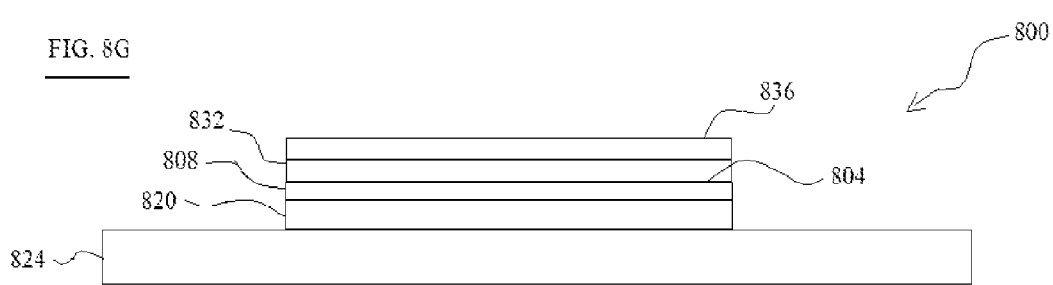

METHODS OF FABRICATING OPTOELECTRONIC DEVICES USING LAYERS DETACHED FROM SEMICONDUCTOR DONORS AND DEVICES MADE THEREBY

RELATED APPLICATION DATA

This application claims the benefit of priority of U.S. Provisional Patent Application Ser. No. 61/403,041, filed Sep. 10, 2010, and Ser. No. 61/456,152, filed Nov. 3, 2010, which are incorporated by reference herein in their entirety.

FIELD OF THE INVENTION

The present invention generally relates to the field of optoelectronic devices. In particular, the present invention is directed to methods of fabricating optoelectronic devices using layers detached from semiconductor donors and devices made thereby.

BACKGROUND

Optoelectronic devices, for example p-n junction based devices, have a wide variety of applications and are typically fabricated using conventional semiconductor-layer-growth/deposition techniques. Some p-n junction based devices, such as light-emitting diodes (LEDs) and laser diodes, are specifically designed to emit light. The light emitted from an LED is created by the recombination of positive and negative charge carriers injected into the junction. The color of light emitted from the LED can be predetermined by choosing junction materials having a desired band gap. The band gap, in turn, defines the energy, and therefore the wavelength (i.e., color), of the light emitted. Other optoelectronic devices operate on related concepts and include many types of junctions and architectures, including PIN junctions, MOSFET transistors, MISFET transistors, and many others.

SUMMARY OF THE DISCLOSURE

In one implementation, the present disclosure is directed to a method of fabricating an electronic and/or optoelectronic device. The method includes providing a semiconductor donor having a detachable layer, liberating the detachable layer from the donor, and incorporating the detachable layer into the optoelectronic device as an electrically functional element of the optoelectronic device.

In another implementation, the present disclosure is directed to a method of fabricating an optoelectronic device having an electrically functional element. The method includes providing a donor having a crystalline semiconductor layer wherein the donor is configured to allow the crystalline semiconductor layer to be liberated therefrom, liberating the crystalline semiconductor layer from the donor, incorporating the crystalline semiconductor layer into the optoelectronic device as the optoelectrically functional element, and providing the optoelectrically functional element with a predetermined thickness based on the optoelectrical function of the optoelectrically functional element.

In still another implementation, the present disclosure is directed to an optoelectronic device. The device includes a first electrical contact designed and configured to connect the optoelectronic device into an electrical circuit, a second electrical contact designed and configured to connect the optoelectronic device into the electrical circuit, and an electrically functional element comprising a detached semiconductor layer detached from a donor of said detached semiconductor layer.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 7 is a flow diagram of an exemplary method of fabricating a p-n junction based device in accordance with the present disclosure;

FIGS. 8A-8G illustrates various steps of the method of FIG. 7;

DETAILED DESCRIPTION

This disclosure addresses, in part, functional optoelectronic devices fabricated by detaching a layer from a lamellar semiconductor donor and incorporating the detached layer into the device as an electrically functional element of the device. As used herein, the term "functional element" refers to an electrical or optoelectrical circuit element that provides a basic electrical or optoelectrical function when subjected to electrical and/or electromagnetic stimulation. In addition, the terms "lamellar material," "lamellar semiconductor donor," and the like includes not only inherently lamellar materials, but also material that are fabricated to be lamellar in their behavior. Several examples of fabricated lamellar materials are described below. Furthermore, the teachings of the present disclosure are applicable to virtually any electronic, optical, optoelectronic, or electro-luminescent device. A number of exemplary devices employing functional elements made from lamellar semiconductor donors are discussed in detail below. However, as those skilled in the art will appreciate, the exemplary devices shown are but a small selection of the devices that can employ the teachings disclosed herein. Further examples of other electrical and opto-electrical functional semiconductor elements appear on page 78 of U.S. Provisional Patent Application No. 61/456,152, filed on Nov. 3, 2010, and titled "NOVEL MATERIAL AND METHOD OF MAKING AN LED AND OTHER OPTO-ELEC- TRONIC DEVICES" (hereinafter, "the '152 application"), and are incorporated by reference herein.

General Overview

Figure 1:
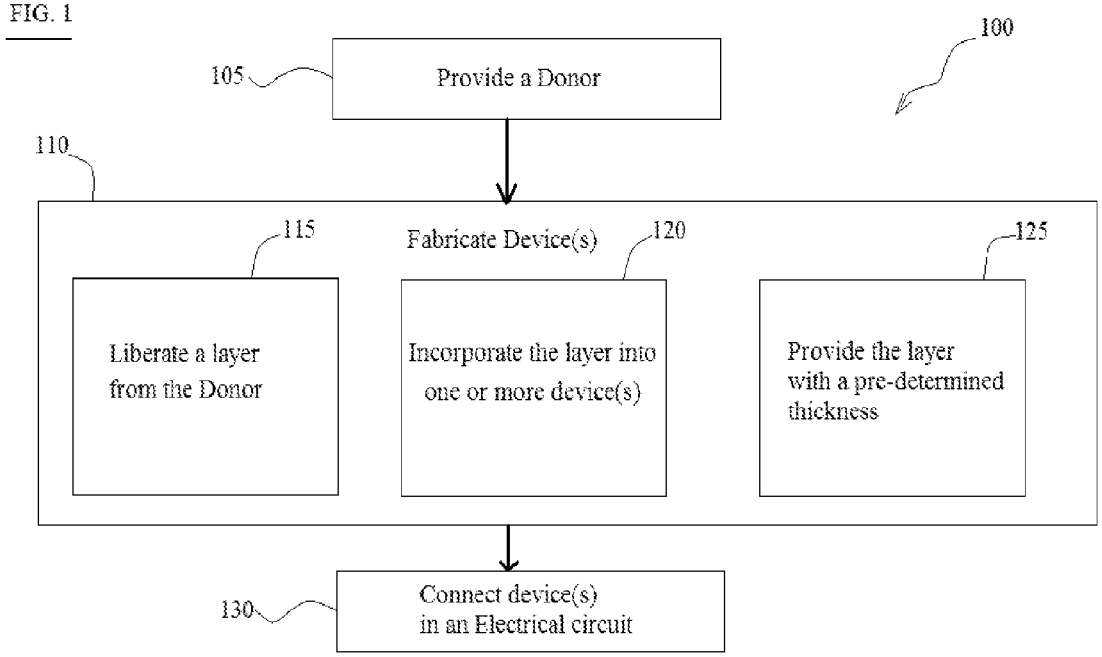
FIG. 1 is a flow diagram of an exemplary method of making an optoelectronic device having a crystalline semiconductor layer as an optoelectronically functional element.

Referring now to the drawings, FIG. 1 illustrates an exemplary method 100 of fabricating one or more optoelectronic devices having a detached lamellar semiconductor layer as an electrically functional element of the device and incorporating the fabricated device(s) into an electrical circuit. At a high level, method 100 begins at step 105 by providing a lamellar semiconductor donor chosen for its optoelectronic characteristics. While the term "optoelectronic" is used throughout this disclosure, it should be understood that the meaning of this term broadly includes any optical, electronic, and/or optoelectronic characteristics of a donor and/or a layer detached from a donor. Examples of optoelectronic characteristics that may guide the choice of the donor include band-gap, resistivity, conductivity, electro-luminescent efficiency, absorption coefficient, and absorption onset. Other factors that may further guide this choice include physical characteristics such as lattice constants, lamellae thickness, and chemical composition. However, these foregoing factors need not be rigidly applied. Other factors that may affect the choice of a donor include the ability to fabricate the donor into a quantum confinement layer, deposit the donor epitaxially, reduce the number and density of dislocations or grain boundaries present, and other factors well known to those skilled in the art. These additional criteria, and others known to those skilled in the art, may be used to choose the lamellar semiconductor donor.

Figure 2:
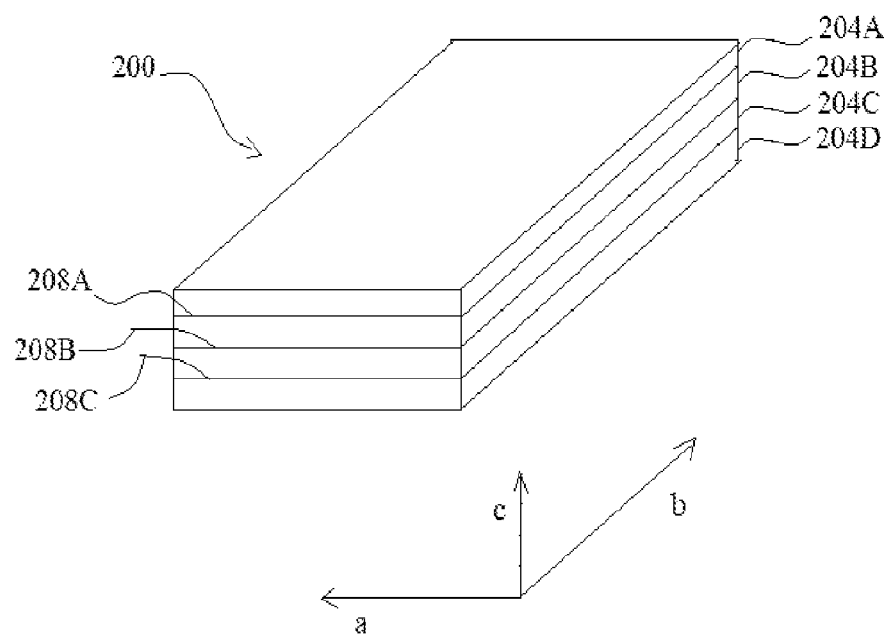
FIG. 2 is a schematic diagram illustrating the structure of a lamellar donor and a fabricated lamellar donors.
Figure 3:
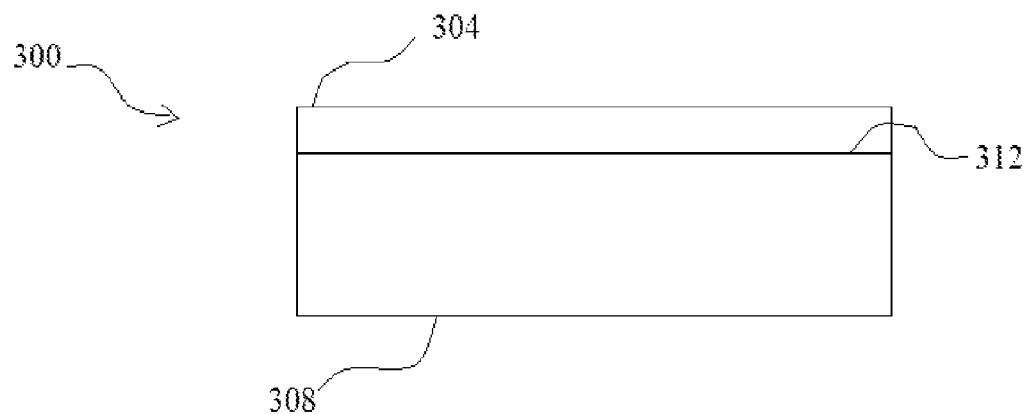
FIG. 3 is a schematic diagram depicting the deposition of a material onto a substrate to create a lamellar donor.

As will become apparent from reading this entire disclosure, the selected donor can have any one of a number of morphologies. For example, a donor can be a single crystal, polycrystalline, micro-crystalline, nano-crystalline, textured, among other morphologies not expressly disclosed. In some embodiments, the semiconductor donor can be a lamellar donor having a plurality of lamellae and a plurality of inter-lamellar spaces, each of which is referred to as a "gallery." FIG. 2 illustrates a donor 200 having four lamellae 204A-204D and three galleries 208A-208C; however, those skilled in the art will readily understand that the donor selected can have fewer or (typically many) more than four lamellae and three galleries. As described in more detail below, lamellar donor 200 can be any of a wide variety of materials, including those that are inherently lamellar, as well as those that require processing to adopt a lamellar-like layered structure. For example, FIG. 3 illustrates a fabricated donor 300 formed by depositing a detachable layer 304 onto a surrogate substrate 308. FIG. 2 and FIG. 3 are described in more detail below.

Continuing with FIG. 1, after selecting the lamellar semiconductor donor at step 105, for example, based on the foregoing criteria and other criteria not specified but appreciated by those skilled in the art, method 100 proceeds to meta-step 110 in which one or more optoelectronic devices are fabricated. In this embodiment, meta-step 110 includes step 115 of detaching a layer from the selected donor, step 120 of incorporating the detached layer into the optoelectronic device(s), and step 125 of modifying the thickness of the detached layer. It is noted that steps 115, 120, and 125 are not shown in any particular order. As will become apparent after reading this entire disclosure, this is so because steps 115, 120, 125 are performed in differing orders depending on the particular materials and techniques used, as well as the type of optoelectronic device(s) being fabricated. Steps 115, 120, 125 are generally described immediately below and are then exemplified in several specific examples.

One possible starting point within meta-step 110 is step 115. At step 115, at least one layer is detached from the lamellar semiconductor donor. Depending on the starting dimensions of the donor, the dimensions of a first layer detached therefrom, and the amount of the donor remaining after detaching the first layer, it is possible that at least one more layer can optionally be detached from the donor by repeating step 115. Detaching the layer from the donor in this step can be accomplished using any one of a number of techniques. For example, the layer can be detached from the donor by cleaving. Cleaving removes the layer along a selected one of its cleavage planes that can coincide with a gallery. Cleaving can be initiated, for example, by scribing or otherwise introducing a crack in the plane of the gallery. The crack can be propagated by, for example, applying a stress having at least a tensile component perpendicular to the plane of the crack or a shear stress component within the plane of the crack. The crack can then easily propagate within the gallery, splitting the weak inter-lamellar bonds. Other cleaving, crack initiation, and crack propagation techniques are sufficiently varied and well known to the skilled artisan that they need not be further described by the present disclosure.

Before proceeding beyond the discussion of step 115, some advantages of cleaving are presented. One advantage of cleaving, for example, is that when performed with sufficient precision, it can produce a detached layer that is only a few lamellae thick. A layer having sufficiently few lamellae, and therefore being sufficiently thin, can act as a quantum confinement layer when integrated into an optoelectronic device as a functional element. Exemplary applications of quantum confinement layers are discussed below in the context of FIG. 9 and FIGS. 10A-10K. Furthermore, because cleaving can detach the layer along a natural cleavage plane, the cleavage surfaces, being substantially coincident with the atomic planes forming the surfaces of the lamellae, can be extremely smooth.

Step 115 can alternatively be accomplished by methods other than cleaving. In one exemplary embodiment of step 115, the lamellar semiconductor donor can be attached to a substrate. This substrate can then be used to peel a layer of a desired thickness from the donor. Optionally, this peeling can be facilitated by first introducing a crack in the donor, as described above, so as to initiate the crack at an approximate predetermined location and produce a layer of an approximately predetermined thickness. In addition to the cleaving and peeling techniques described above, step 115 can also be accomplished using other techniques including, but not limited to, sawing, laser scribing, pressurized fluid cutting, thermally induced stress fracturing, microtome, ultramicrotome, ultratome, exfoliation by vacuum or intercalation, and other techniques known to those skilled in the art. Additional cleaving techniques can be chosen from the list of techniques outlined on pages 23-28 of the '152 application, that are incorporated by reference herein.

At step 120, another step within meta-step 110, the detached layer is incorporated into the optoelectronic device as a functional element. Fundamentally, there is no limitation on the type of device into which the layer can be incorporated. For example, the detached layer can be incorporated into an LED, a laser diode, a FET, a PIN junction, or any of many other optoelectronic devices. Nor is there a limitation on the type of functional element for which the layer can be used. For example, the layer can be used as one side, or part thereof, of a p-n junction, a quantum confinement layer, or a luminescent layer, among other types of functional elements. A person skilled in the art will appreciate that these are only a limited selection of examples and that the detached layer can be applied to any device and any functional layer. A small selection of some of these exemplary devices are presented in the present disclosure, although the teachings disclosed herein can be applied to other devices not expressly presented.

Step 125 involves providing the detached layer with a predetermined thickness as needed for the desired functionality of the optoelectronic device. At step 125, the thickness of the layer can be modified by adding or removing material, thereby providing the layer with an approximate predetermined thickness selected to meet one or more physical and/or opto-electrical design criteria. This approximate predetermined thickness can be achieved using the techniques described below, as well as others not expressly mentioned but well known in the art. Before discussing some exemplary techniques in detail, it is noted that these techniques generally fall into two broad categories: techniques used to increase the thickness of the layer and techniques used to decrease the thickness of the layer.

If the detached layer is too thin to meet the design criterion (ia), then its thickness can be increased by adding material using a number well-known techniques. These techniques include, but are not limited to, chemical vapor deposition, sputtering, or other techniques used for crystalline or amorphous material growth. Other means of adding material to a layer are well known to the skilled artisan and need not be further recited in the present disclosure. One additional factor that can determine the technique used is whether the additional material will be deposited homo-epitaxially or a hetero-epitaxially. While this additional factor can optionally be used, skilled artisans will appreciate that many other factors can also be used to decide the deposition technique without departing from the teachings of the present disclosure.

Furthermore, after depositing additional material at step 125, whether crystalline or amorphous, homo-epitaxial or hetero-epitaxial, or any other characteristic not mentioned, the layer may be further modified by altering the grain structure. Altering the grain structure may, in turn, alter the opto-electronic properties of the layer. For example, annealing the layer to increase the grain size also increases charge carrier mobility and those aspects of device performance dependent on charge carrier mobility. Example techniques used to modify grain structure include rapid thermal annealing, furnace annealing, argon ion laser annealing, metal induced crystallization, zone melt re-crystallization, and other grain modification techniques well known in the art. Additional techniques for increasing layer thickness can be chosen from the list of techniques outlined on page 29 of the '152 application, that are incorporated by reference herein.

If the detached layer at step 125 is too thick to meet the design criterion(ia), exemplary techniques of material removal include, but are not limited to, repeating the separation method previously used in the process at step 115, cleaving along an inherent cleavage plane or other plane of weakness, wet chemical etching, reactive ion etching, or plasma etching. These, and other material removal techniques well known in the art, can be applied to achieve the desired thickness of the functional element without departing from the teachings of the present disclosure. Additional techniques for reducing layer thickness can be chosen from the list of techniques outlined on page 28 of the '152 application, that are incorporated herein by reference.

One feature related to the thickness of the detached layer, and applicable to all steps of meta-step 110, is the ability to increase a band gap of a layer over the inherent band gap of the material forming the layer by thinning a layer to less than about 100 nm, and in some cases less than about 10 nm, although the actual thickness at which the band gap increases can vary between 100 nm to less than 10 nm depending on the composition of the layer. For example, for some materials tuning the thickness of the detached layer to less than about 50 nm will be sufficient for achieving the desired band gap tuning, whereas other materials may require tuning to a thickness of less than about 30 nm. Therefore, regardless of the method used, steps 115, 120, and 125 can be used, alone or in combination, to tune the band gap of the layer to further meet the desired optoelectronic characteristics of the device. This feature is discussed in more detail below in the context of FIGS. 4 and 5.

The foregoing presentation of steps 115, 120, and 125 is not meant to imply a particular order to those steps. For example, a layer could be detached from a donor at step 115, its thickness modified at step 125, and incorporated into a device at step 120. In another example, step 125 of providing a predetermined thickness could be performed first, followed by step 120 and then by step 115. In addition, it is noted that ones of steps 115, 120, 125 can be performed simultaneously with one another. For example, if step 115 of liberating the layer from the donor results in the thickness of the layer being its desired value, then step 125 of providing a predetermined thickness is essentially subsumed in the liberating step. As can be appreciated, still other orders of meta-step 110 are possible without departing from the teachings of the present disclosure.

At any point within, or after, meta-step 110 and at any point in relationship to steps 115, 120, and 125, it may be desirable to measure the thickness of the detached layer before, during, or after adjustment. The thickness of the detached layer can be measured by mechanical means, such as graduated caliper or micrometer, or by other means. These means include optical ellipsometry, other optical techniques, sonic techniques, and other direct and indirect measurement methods well known to those skilled in the art. Upon completion of this optional measurement, the thickness can be further reduced or increased using any of the techniques described above.

Figure 6:
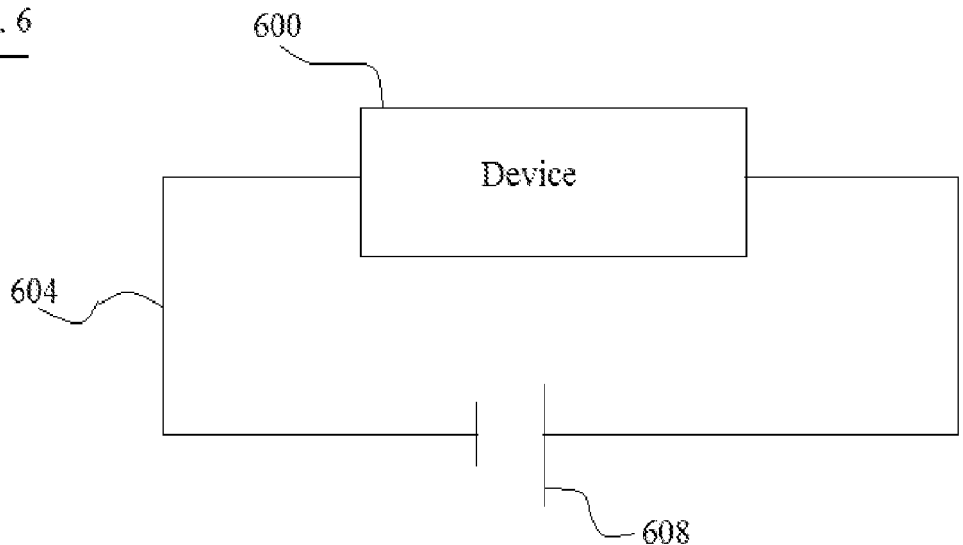
FIG. 6 depicts an exemplary embodiment of a circuit containing a device having a detached layer incorporated therein as an electrically functional element of the device.

Continuing with FIG. 1, after completing meta-step 110, the resulting device(s) is/are integrated into an electrical circuit at step 130. FIG. 6 illustrates this schematically, with a device 600 fabricated at meta-step 110 incorporated into an electrical circuit 604 that in this example includes a battery 608. Of course, those skilled in the art will readily appreciate that FIG. 6 is a hyper-simplification and that actual circuits will typically be much more complex. In addition, those skilled in the art will understand that battery 608 can be replaced with any suitable electrical power source, or, if circuit is working in the opposite direction, any power sink or storage device.

Returning now to FIG. 2, in one example wherein donor 200 is an inherently lamellar semiconductor, lamellae 204A-D are associated with one another by weak bonding, such as Van der Waals bonding, that extends through inter-lamellar galleries 208A-C. This type of physical structure is relevant to the present disclosure, and to the fabrication of optoelectronic devices, for a number of reasons. One reason is that the weak inter-layer bonding allows lamellae 204A-D to be easily removed from donor 200 in small numbers. This, in turn, facilitates the use of lamellae 204A-D in optoelectronic devices. As discussed previously, this feature of donor 200 can be used to facilitate the processes shown and described in the context of FIG. 1.

Another reason that the physical structure of certain inherently lamellar semiconductor donors, such as donor 200 depicted in FIG. 2, is relevant to the present disclosure is that, because lamellae 204A-D are thin (often on the order of approximately 1 nm to approximately 10 nm), they can be used in functional elements with sub-micron dimensions.

While conventional optoelectronic devices are typically formed using multiple layer growth/deposition processes, donor 200 can provide a functional component of the device by mere separation of a layer consisting of one or several lamellae from a suitable donor because of the weak bonding described above. Furthermore, because donor 200 can be grown to nearly any dimension, it is not solely limited to sub-micron applications. Also, as discussed in more detail below, sufficiently thin groups of lamellae 204A-D can be used as quantum confinement layers because their thickness approaches that of the de Broglie wavelength of the charge carrier (approximately between 1 nm and 100 nm, depending on the composition of the layer).

A further reason that the physical structure of an inherently lamellar donor, such as donor 200, is relevant to the present disclosure is that, in contrast to the nanometer-scale thickness of layers 204A-D along the c-axis, the crystal dimensions in the a-b plane can be millimeters or centimeters long, or longer. This physical anisotropy permits lamellar semiconductor donors to be used in applications requiring the functional element to be nanometers thick along the c-axis, and much larger in the a-b plane. While these three reasons are apparent, other reasons will also become apparent to those skilled in the art in light of the present disclosure.

Some examples of lamellar semiconducting materials that can be used as donor 200 for purposes in furtherance of the broad teachings of the present disclosure include, but are not limited to, $GaS$, $GaSSe$, $2H-SnS_2$, $ZrS_3$, $HfS_2$, $HfS_3$, $WS_2$, $CdPSe_3$, $SnPS_3$, $Cu_3PS_4$, $Cu_{6-x}PS_5I$, $Ga_2Se_3$, $ZnIn_2S_4$, $GaSe_{1-x}S_x$, $GaS_{1-x}Se_x$, $BiI_3$, $Bi_2S_3$, $Bi_2Se3$, $Bi_2Te_3$, $CrB_{r3}$, $Fe_3S_4$, $FeC_{13}$, $FeB_{r3}$, $GaTe$, $GeS$, $GeSe$, $Ga_2S_3$, $Ga_2Se_3$, $Ga_2Te_3$, $GeS_2$, $GeAs_2$, $GaSe_{1-x}Te_x$, $GaSe_{1-x}S_x$, $HgI_2$, $HfS_2$, $HfS_3$, $HfSe_2$, $HfSe_3$, $InS$, $InSe$, $In_{0.52}Se_{0.48}$, $In_2S_3$, $In_2Se_3$, $In_2Te_3$, $MoS_2$, $MoSe_2$, $MoTe_2$, $M^{2+}PS_3$, $M^{2+}PSe_3$, $2H-MoS_2$, $Mo_{1-x}W_xSe_2$, $NbS_2$, $NbSe_2$, $PbI_2$, $PtS_2$, $PtSe_2$, $ReS_2$, $ReSe_2$, $SnS$, $SnSe$, $SnS_2$, $SnSe_2$, $SbI_3$, $SiS$, $Sb_2S_3$, $SnSe_{2-x}S_x$, $SnS_{2-x}Se_x$, $Sb_2Se3$, $Sb_2Te_3$, $TiS_3$, $TiC_{13}$, $TiB_{r3}$, $1T Ta_{S2}$, $2H TaSe_2$, $3R TaSe_2$, $TiX_2$ (X=S, Se), $WSe_2$, $ZrS_2$, $ZrS_3$, $ZrSe_2$, $ZrSe_3$, $Zr(S_{1-x}Se_x)_3$, $MnIn_2Se4$, $MgIn_2Se_4$, $Zn_mIn_2Sm_{+3}$ (m=1, 2, 3, 4, 5), $Ge_mBi_2Te_{m+3}$, $Pb_2Bi_2Se_5$, $Bi_2Te_2S$, $FeAl_2S_4$, $GaPS_4$, $MoS_xSe_{2-x}$, $WS_xSe_{2-x}$, $MoSe_xTe_{2-x}$, $Mo_xW_{1-x}Se_2$, $MnPSe_3$, $FePS_3$, $FePSe_3$, $NiPS_3$, $CdPSe_3$, $SnPS_3$, $SnPSe_3$, $In_{2/3}PSe_3$, $PdPS$, $PdPSe$, $Pd_3(PS_4)_2$, $Cu_3PS_4$, $Cu_{6-x}PS_5I$. Indeed, these exemplary lamellar materials, as well as other lamellar materials not listed, are applicable to any of the broad teachings disclosed herein.

A specific material that can be used as donor 200 is GaSe. This inherently lamellar material, in its stoichiometric and non-stoichiometric formulations, can be an intrinsic semiconductor or doped to be an n-type or p-type semiconductor. Its fundamental band gap is approximately in the range of 1.98 eV-2.2 eV. This material property can, as described later in this disclosure, be further tuned by separating a sufficiently thin layer of GaSe from donor 200. If sufficiently thin, the band gap of a GaSe layer can increase to approximately in the range of 2.0 eV-2.7 eV. This latter shift enables LEDs having GaSe as an optoelectronically functional element to emit light having wavelengths from approximately 450 nm to approximately 620 nm, which beneficially includes the green portion of the visible-light spectrum.

While GaSe can be used as donor 200 in cases where the donor band gap is between approximately 2.0 eV-2.7 eV, other lamellar materials having different band gaps can also be used for the donor. For example, a lamellar material having a band gap from about 1.8 eV to about 2.5 eV can be used for donor 200. Compositions having a band gap in this range include, but are not limited to, $ZrS_3$, $HfS_2$, and others. In other examples, donor 200 can be formed by a lamellar material having a band gap from about 2.5 eV to about 4.5 eV. Compositions having a band gap in this range include, but are not limited to, $GaS$, $ZnIn_2S_4$, $GaSe_{1-x}S_x$, $GaS_{1-x}Se_x$, and others.

Continuing with FIG. 2, the teachings of the present disclosure do not require donor 200 to be inherently lamellar, but rather also include fabricated lamellar materials. In this case, lamellae 204A-D can be considered to be artificial, or fabricated lamellae. For example, in some embodiments, donor 200 can be fabricated by aligning crystallites and forming them into a fabricated lamellar structure using a "semiconductor-paper-forming" process. In this process, anisotropic particles are suspended in a fluid medium. The particles are then deposited onto a substrate such that the particles self-align because of their anisotropic morphology. This self-alignment process then forms layer of at least approximately aligned particles on the substrate. The particles may then be bound together to form a unified sheet using a binder, pressure, temperature or other means. This process may be repeated thereby building up a multiple sheets on the substrate, thereby forming the structure shown in FIG. 2, with fabricated lamellae 204A-D corresponding to the multiple fabricated sheets of aligned particles. Example techniques for making such fabricated lamellae are discussed on pages 104-108 of the '152 application, that are incorporated herein by reference.

Another example of a fabricated lamellar material is formed by depositing crystallites directly onto a substrate. In this example, crystallites of a material are deposited onto a substrate and treated with pressure and/or temperature in order to create a layered, fabricated lamellar structure. The crystallites can be dimensionally anisotropic so as self-orient into a textured film when deposited onto the substrate. Example technique for making such fabricated lamellae are discussed on pages 98-104 of the '152 application, that are incorporated herein by reference.

Returning to FIG. 3, donor 300 is another exemplary embodiment of a fabricated donor. In one example, layer 304 is deposited onto surrogate substrate 308 such that a plane of weakness exists between the deposited layer and the surrogate substrate at layer/surrogate substrate interface 312. In one example, GaSe is used for layer 304 and is deposited onto surrogate substrate 308 made, for example, of ZnS. In other examples, molybdenum disulfide can be used for layer 304. In yet other examples, molybdenum metal foil can initially perform the function of surrogate substrate 308 and then be selenized in-situ to yield a top layer of $MoSe_2$, thereby forming layer 304. In the foregoing examples, layer 304, after being formed, is detached from substrate 308 and incorporated into a device, for example, in accordance with meta-step 110 of method 100 of FIG. 1.

In other embodiments, layer 304 can be fabricated as a lamellar layer from which multiple layers can be detached before depleting donor 300. For example, oriented layered coatings of graphite or graphene can be deposited as layer 304 onto surrogate substrate 308, which can be made from nickel metal foil. As another example, surrogate substrate 308 is nickel-coated silicon onto which a layered coating of graphite or graphene is deposited to form layer 304. Under appropriate heat treatment and cooling, the carbon orients itself as a layered graphite/graphene coating. Those skilled in the art will appreciate that the teachings of the present disclosure are applicable not only to graphite/grapheme, but also to many other different chemical compositions, including those presented throughout the disclosure.

Another inorganic material family that can be used to form layer 304 is the diChalcogenide family. These materials can be deposited onto surrogate substrate 308 using iodine vapor transport, thereby forming layer 304. The skilled artisan will appreciate that many other materials, when properly processed, can act as layer 304 after being deposited onto an appropriate surrogate substrate 308, and form cleavage planes parallel to layer/surrogate substrate interface 312. Furthermore, layers having different chemical compositions, lattice structures, and crystal morphologies can be successively deposited using the teachings presented above, thereby creating layer 304 having multiple sub-layers, wherein each sub-layer has different optoelectronic properties. These layers can then be detached as a whole, resulting in a composite layer 304, or detached separately, and used as a functional element of a device as described above relative to method 100 of FIG. 1.

Continuing with FIG. 3 in more detail, a single crystal film can be epitaxially deposited on surrogate substrate 308, thereby forming layer 304, in a manner that mimics the highly oriented structure of inherently lamellar semiconductor donors. Deposition methods are well known in the art, and include homo- and hetero-epitaxial deposition using chemical vapor deposition, molecular beam epitaxy, sputtering, and other techniques. In one example of hetero-epitaxial deposition, the lattice constant of surrogate substrate 308 can be approximately equal to that of layer 304. In another example, the lattice constants can be highly mismatched. This mismatch may be acceptable because some lamellar donors materials, like GaSe, can have intrinsic compliance in their crystal structures that can accommodate epitaxial mismatch.

In the context of FIG. 3, and indeed throughout this entire disclosure, surrogate substrate 308 can be either single-use or re-useable, and layer 304 can be attached via either a permanent bond or a reversible bond. Possible features used to select surrogate substrate 308 include, but are not limited to, lattice constant, rigidity, flexibility, degree of transparency, and electrical conductivity.

In a more specific embodiment of the example depicted in FIG. 3, lamellar semiconductor GaSe, functioning as layer 304, can be grown on a ZnS single crystal substrate, which functions as surrogate substrate 308. After the GaSe crystal has grown sufficiently thick, layers can be cleaved or otherwise detached from it for subsequent fabrication of an optoelectronic device, as disclosed herein. Other types of surrogate substrate 308 materials and layer 304 materials discussed in the present disclosure can also be applied to this teaching. Examples of other layer 304 include, but are not limited to, pyrolytic boron nitride, pyrolytic graphite, and highly oriented versions thereof that have been processed under pressure.

As mentioned above, the bond between the surrogate substrate 308 and layer 304 can be permanent or reversible. A reversible bond facilitates convenient removal of donor 304 and optional re-use of surrogate substrate 308. Exemplary reversible bonding methods include, but are not limited to, vacuum or electo-static chucks, techniques utilizing capillary action and/or the surface tension properties of liquids, anodic bonding, optical contact bonding, eutectic bonding, solder bonding, thermocompression bonding, Frit bonding, waxes, glues, silicones, adhesives, polymers, and other soluble coatings. Other methods of reversible bonding are well known in the art and may be used without departing from the broad teachings of the present disclosure.

Exemplary materials that can be used for surrogate substrate 308 include, but are not limited to polymers, metals, papers, fabrics, glasses, ceramics, and combinations thereof. Examples of metallic substrates include aluminum, copper, steel, carbon steel, magnesium, stainless steel, titanium, super alloys, lead, nickel, brass, gold, silver, platinum, rhodium, incoloy, inconel, iron, molybdenum, monel, nichrome, chromium, tantalum, tin, tungsten, zinc, solder (Sb/Tn), invar, kovar, and others. The respective alloys of these metals can also be used. Furthermore, the metals can be untempered or tempered. Further examples of conductive substrate materials include graphite sheets, and conductive carbon nanotube sheets, films, and foils. Insulator substrate materials can be natural or synthetic and can have chemical compositions containing oxides, sulphides, selenides, tellurides, fluorides, chlorides, bromides, iodides, borides, nitrides, carbides, phosphides, arsenides, silicides, glass, glass with polymer sheets, ceramic mats, ceramic paper, or ceramic fibers or any combination thereof. Semiconductors substrate materials can be silicon, germanium, AlGaAs, GaAs, GaP, InP, ZnO, ZnS, ZnSe, GaN, and other similar materials. Organic materials can include organic polymers, inorganic polymers, organometallic polymers, hybrid organic/inorganic polymer systems. Examples of polymers, can include, for example polyethlyene terephthalate (PET), polyethylene naphthalate (PEN), or high temperature polymers such as polyether sulfone (PES), polyimides, or Transphan™. Other examples include E-CTFE, E-TFE, PTFE, FEP, and HDPE. Synthetic resins include both thermoplastic resins and thermosetting resins, such as polyolefins, e.g. polyethylene, polypropylene, ethylene-propylene copolymers, and ethylene-vinyl acetate copolymers (EVAs). Synthetic resins further include: cyclic polyolefins; modified polyolefins; polyvinyl chloride; polyvinylidene chloride; polystyrene; polyamides; polyamide-imides; polycarbonates; poly-(4-methylpentene-1); ionomers; acrylic resins; polymethyl methacrylate (PMMA); acrylonitrile-butadiene-styrene copolymers (ABS resins); acrylonitrile-styrene copolymers (AS resins); butadiene-styrene copolymers; polyoxymethylene; polyvinyl alcohol (PVA); ethylene-vinyl alcohol copolymers (EVOHs); polyesters, e.g. polyethylene terephthalate (PET), polybutylene terephthalate (PBT), and polycyclohexane terephthalate (PCT); polyethers; polyetherketones (PEKs); polyether-ether-ketone (PEEKs); polyetherimides; polyacetals (POMs); polyphenylene oxides; modified polyphenylene oxides; polysulfones; polyphenylene sulfide (PPS); polyether sulfones (PESs); polyarylates; aromatic polyesters (liquid crystal polymers); polytetrafluoroethylene; polyvinylidene fluoride; other fluorine resins; thermoplastic elastomers, e.g. styrene-, polyolefin-, polyvinyl chloride-, polyurethane-, polyester-, polyamide-, polybutadiene-, trans-polyisoprene-, fluorine rubber-, and chlorinated polyethylene-type; epoxy resins; phenol resins; urea resins; melamine resins; unsaturated polyesters; silicone resins; and polyurethanes; and copolymers, blends, and polymer alloys essentially consisting of these synthetic resins. One or more of these synthetic resins can be used, for example, as a composite consisting of at least two layers.

It is noted that many of the above materials can allow surrogate substrate 308 to be flexible as needed to suit a particular application. This flexibility has many practical implications as it relates, for example, to future flexible display and flexible macro-electronics and to general electronics platforms. For example, flexible electronic components made in accordance with methods of the current disclosure can be made conformal (i.e., able to conform to a curve and remain so curved), flexible (i.e., able to flex under applied force and revert back to its original shape when the applied force is removed), rollable (i.e., able to be rolled around an object, e.g., a cylinder, back and forth under applied force) and/or foldable (i.e., able to be folded back and forth along an axis under an applied force). Those skilled in the art will readily appreciate that conformal, flexible, rollable and foldable electronic components can be fabricated using the teachings of the present disclosure in conjunction with a flexible substrate that is used for a given application. Furthermore, a flexible substrate then permits fabrication in a suitable roll-to-roll or reel-to-reel environment.

For those embodiments of the foregoing processes in which donor 304 is deposited on surrogate substrate 308, any deposition technique that preserves or enhances the lamellar character of the donor can be used. These techniques include, but are not limited to, PVD, filament evaporation, RF heating, electron beam, ion assisted electron beam, sputtering, diode sputtering, magnetron sputtering, DC sputtering, bias sputtering, RF sputtering, laser reactive deposition, pulsed laser deposition (PLD), atomic layer deposition (ALD), IBAD, MBE, MVD, CVD/Thermal CVD/LPCVD/PECVD/APCVD/HDPCVD/ECR-PECVD/LTPECVD/MOCVD/PVD/hot-wire CVD, sol gel, evaporation, molecular beam (MB) evaporation, ion-plating, electro-plating, dip-plating (dipping), dip coating, electroless-plating, spin-coating process, spray-coating process, plasma thermal spray coating, and roll-on coating process; printing processes, transfer processes, ink jet processes, powder-jet processes, Langmuir-Blodgett process or its variants such as Schneider-Picard (SP) process, dynamic surface tension process (DST), wet electro-static transfer, dry electro-static transfer, slot die extrusion, electro spraying or electro-static coating (air electrolyte), electro wetting, plasma thermal spray, electro spray, and other techniques well known in the art.

Continuing with FIG. 3, layer 304 can be re-crystallized, if so desired, using rapid thermal annealing (RTA), rapid thermal processing (RTP), furnace annealing, lamp annealing, argon ion laser annealing, ELA (excimer laser annealing), phase modulated ELA, SA-ELC, metal induced crystallization (MIC), metal induced lateral crystallization (MILC), zone melt recrystallization (ZMR). The skilled artisan will appreciate that these are but a selection of techniques that can be used to re-crystallize, or otherwise change the grain structure of, the deposited films.

Figure 4:
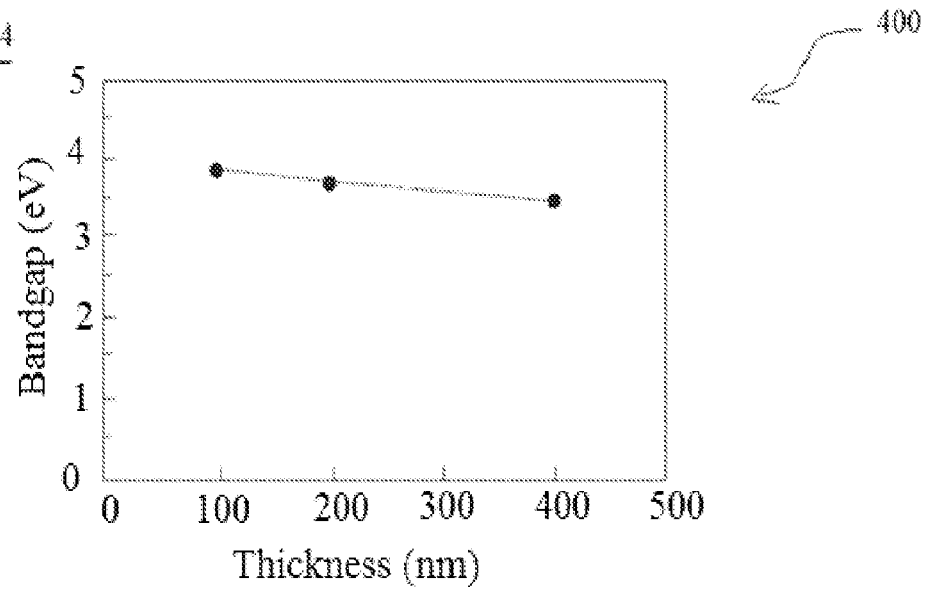
FIG. 4 depicts the relationship between the thickness and the band gap of a material.
Figure 5:
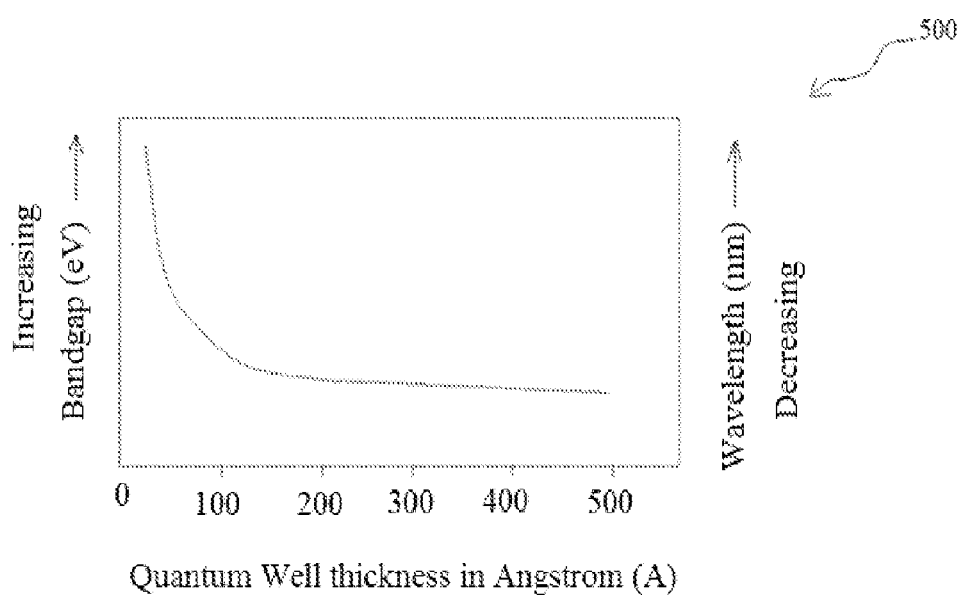
FIG. 5 further depicts the relationship between a material dimension and the band gap of a material for materials having at least one dimension less than 300 Angstroms, and particularly less than 100 Angstroms.

Turning now to FIGS. 4 and 5, band gap, while primarily an intrinsic material property, can be tailored by tailoring the thickness of an optoelectronic functional element to be less than 100 nm, and in some cases to less than 10 nm, in order to induce quantum confinement effects within the element. This relationship between thickness and band gap is shown in graph 400 of FIG. 4 and can be deliberately exploited by thinning the optoelectronically functional element by, for example, cleaving as described above. Furthermore, as depicted in graph 500 of FIG. 5, because of quantum confining effects, the shift in band gap is accentuated for structures having at least one dimension less than 500 Angstroms, and preferably less than 10 Angstroms. Those skilled in the art will appreciate that quantum confining effects can be possible at any of a number of layer thicknesses from 1 nm to 100 nm, depending on the chemical composition of the layer. In addition to modifying the band gap by tuning the thickness of the detached layer by cleaving, or by other suitable means as disclosed above, as mentioned above the band gap can also be modified using an intercalant.

Lamellar Semiconductor Donors and P-N Junctions

As presented above, the detached layer from a lamellar donor can be incorporated into a device/circuit using, for example, method 100 of FIG. 1. As a particular example, FIG. 7 illustrates a method 700 that utilizes step 105 and meta-step 110 of method 100 in forming an optoelectronic device 800 (FIG. 8G) having a p-n junction 804 that includes a layer 808 detached from a suitable donor. As will become apparent from reading on, the steps of method 700 need not necessarily be performed in the order presented to achieve an equivalent result. Furthermore, those skilled in the art will appreciate that many similar devices, including PIN junction based devices, and heterojunction based devices, and others can be fabricated using the steps presented.

Referring now to FIGS. 8A-G, and also to FIG. 7, at step 705 of method 700, a lamellar semiconductor donor 812 (FIG. 8A) is selected based on factors and criteria discussed elsewhere in this disclosure. For the purposes of fabricating a p-n junction, donor 812 will typically be doped as either an n-type or p-type semiconductor. The type of dopant is essentially irrelevant for the purposes of the method of FIG. 7 as long as the other side of p-n junction 804 (FIG. 8G) is oppositely doped, as will be described. As is well known in the art, doping techniques that can be used include ion implantation, interstitial vacancy creation, thermal treatment, and others. Furthermore, as alluded to above, doping can also be performed using an intercalant that enters the lamellar galleries.

Figure 8A:
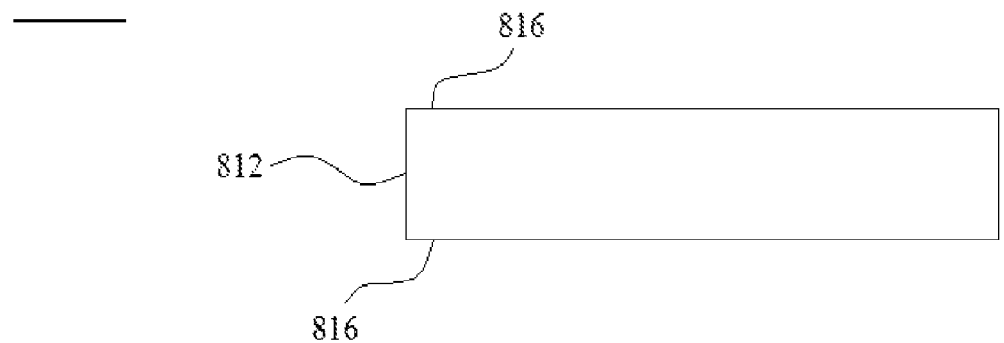
Figure 8B:
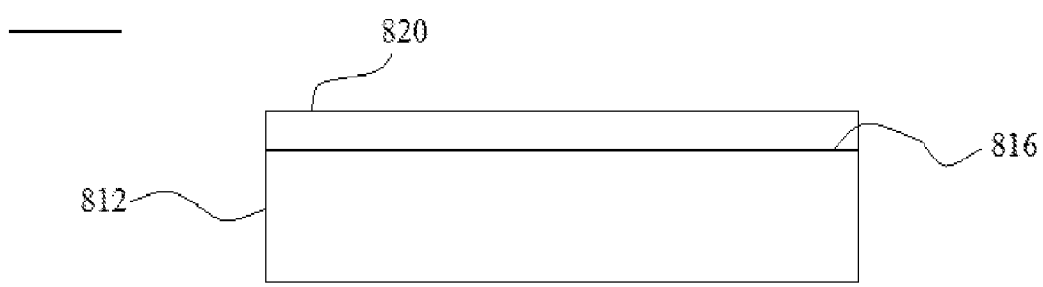
Figure 8C:
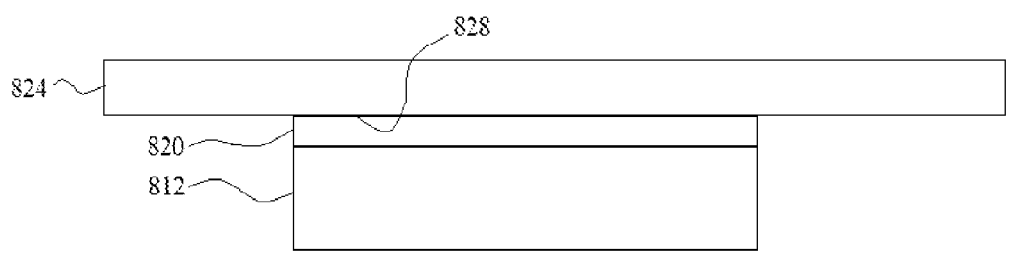

Continuing with FIG. 8A, after donor 812 has been selected, a surface 816 of the donor can be prepared at optional step 710. This optional step typically includes cleaning surface 816 of donor 812. Cleaning techniques are well known in the art and include wet or dry chemical etching, plasma cleaning, UHV annealing, among others.

At step 715, a contact 820 (FIG. 8B) is deposited upon surface 816 of donor 812 to facilitate electrical contact with one or more other elements, such as an electrical conductor of the circuit (not shown) that finished optoelectronic device 800 (FIG. 8G) will be a part. Depending on the intended use of device 800, contact 820 can be either transparent or opaque. For example, if the intended use is for light emission, contact 820 can be transparent in order to facilitate transmission of the emitted light. Transparent materials useable for contact 820 include, but are not limited to, transparent conductive oxides, transparent conductive nitrides, transparent conductive oxy-nitrides, organic conductive polymers, and conductive fillers or nano-structures dispersed in a matrix. For other uses, contact 820 can be opaque. Opaque materials useable for contact 820 include, but are not limited to, metals such as Al, Ag, Au, Cu, and other conductive elements and alloys thereof. Specific examples of material in each of these categories are well known in the art and need not be recited herein. Furthermore, as is also well known in the art, additional layers, including but not limited to, confinement layers or electron-blocking layers, can be interspersed between the contact 820 and donor 812.

At step 720 a substrate 824 (FIG. 8C) is attached to contact 820 to, for example, facilitate the fabrication of device 800. Contact 820 is then bonded to substrate 824, forming a contact/substrate bond 828. Substrate 824 can be either temporary or permanent, and can also be made from the materials previously described, including those discussed in the context of a surrogate substrate. Similarly, the methods of reversible and permanent bonding discussed above in the context of FIG. 3 are also applicable to the bonding of substrate 824 to contact 820. Substrate 824 can be a temporary, intermediary, or permanent surrogate substrate, depending on a number of factors, including the nature of the device being fabricated and the impact the substrate would have if left intact after serving its function. Depending on the nature of substrate 824 and the type of bond desired, the contact/substrate bond can be cured at optional step 725. Furthermore, if p-n junction 804 (FIG. 8G) is intended for use in an LED, substrate 824 can incorporate features to enhance light emission. For example, substrate 824 can have any one of a number of additional layers or coatings deposited on it. These layers include, but are not limited to, anti-reflective, anti-fingerprint, anti-static, anti-corrosion, chemical resiliency, UV protection, electrically conductive, polarizing, and scratch resistant coatings, individually and in combination with one another. Furthermore, substrate 824 can be textured, roughened, or patterned to increase light emission from the device. Other options can be incorporated as those skilled in the art are well aware.

Figure 8D:
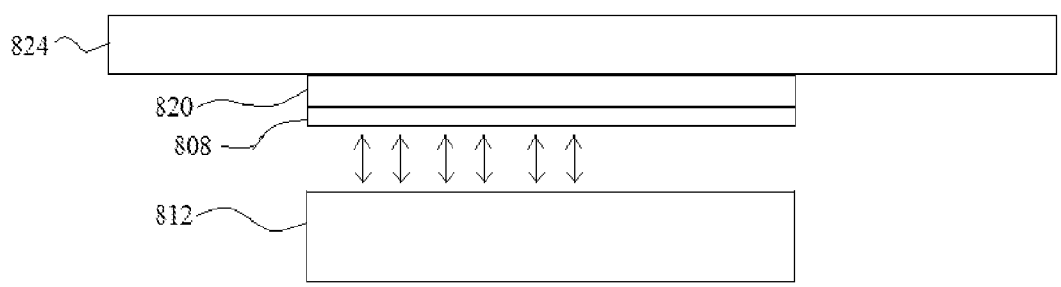
Figure 8E:
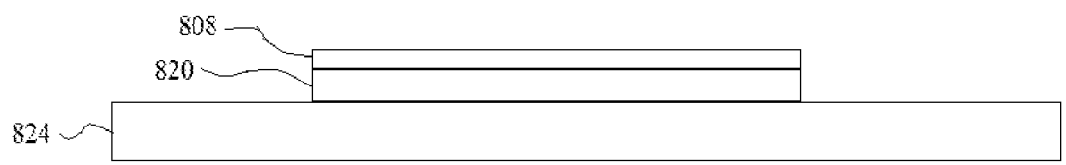

At step 730, depicted in FIG. 8D, layer 808 is detached from donor 812 at a desired location so as to leave the layer attached to contact 820 that in turn remains attached to substrate 824. Layer 808 will, upon additional processing described below, form one side of p-n junction 804 (FIG. 8G). After layer 808 has been separated from donor 812, its thickness can be measured at optional step 735 in order to determine whether the thickness is sufficient to meet the design of device 800, as previously discussed in the context of FIG. 1. Similarly, at optional step 740 (FIG. 8E), the thickness of layer 808 can be increased or decreased, if needed, as desired in the context of the device design criteria and using methods previously described and also those methods well known to the skilled artisan.

Figure 8F:
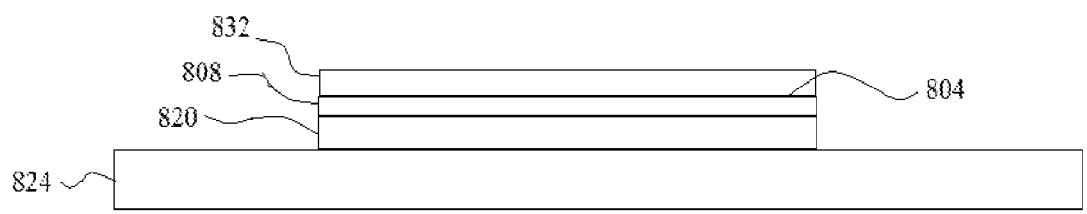

At step 745, illustrated by FIG. 8F, an oppositely doped layer 832, having the doping type opposite of the doping type of detached layer 808, is grown, deposited, or otherwise attached to the layer. While oppositely doped layer 832 can be grown, an alternative embodiment includes attaching another lamellar detached layer having the opposite doping type relative to the doping of detached layer 808. In this alternative embodiment, the oppositely doped detached layer 832 can be attached to detached layer 808 using fusion bonding or other technique known to those skilled in the art. Oppositely doped layer 832 can be placed into contact with layer 808 using any of the techniques described in this application including cleaving, sputtering, molecular beam epitaxy, chemical vapor deposition, and other techniques well known in the art. Oppositely doped layer 832 can also be epitaxially grown or deposited onto layer 808 using the same, but oppositely doped, material, thereby forming a homo-epitaxial layer. In other examples, oppositely doped layer 832 can be a different, oppositely doped material, thereby forming a hetero-epitaxial layer. Oppositely doped layer 832 need not be epitaxially grown at all, and can even be made from an organic, as well as an inorganic, semiconductor material. Furthermore, oppositely doped layer 832 can be a single crystal or not. As those skilled in the art will appreciate, the design criteria of device 800 (FIG. 8G) will guide the choice of whether p-n junction 804 will be a hetero-junction, a homo-junction, epitaxially grown, doped, or any combination thereof. After being deposited, layer 832 can be annealed to change the grain structure and dislocation density, as described elsewhere in this disclosure.

At step 750, illustrated by FIG. 8G, a second contact 836 is deposited onto oppositely doped layer 832. The features of second contact 836 can be the same as the features of contact 820 discussed above in the context of step 715 and need no further recitation. As a skilled artisan will appreciate, other layers can be added to p-n junction 804 so as to enable and/or enhance its performance as an LED or other optoelectronic device. Examples of such layers have been presented above and further include hole injection layers, hole blocking layers, hole transport layers, electron injection layers, electron blocking layers, electron transport layers, cladding layers, distributed Bragg reflector layers, and others.

Lamellar Donor as a Quantum Confinement Structure

A layer, including one from a lamellar material, can function as a quantum confinement structure in cases where at least one dimension of the layer is on the order of the de Broglie wavelength of a charge carrier. A structure having one, two, or three dimensions less than the de Broglie wavelength is often referred to as a quantum confinement layer (also known as a quantum well, quantum wire, and quantum dot respectively). As discussed above, at least one dimension must be approximately less than about 100 nm, to be on the order of the de Broglie wavelength, although the actual dimension value is a function of the chemical composition of the layer. In this regard, for those lamellar donors having a lamellar thickness on the order of <50 nm, a quantum well can be formed by detaching only a few lamellae, thereby producing a detached layer on the order of the de Broglie wavelength. Lamellar layers are not limited to functioning as quantum wells, however. In other examples, a lamellar superlattice can be further divided along one or more Cartesian axes (as shown in FIG. 2) so as to form a quantum wires.

As discussed above with respect to FIGS. 4 and 5, quantum confining structures can cause a shift of the band gap that is inherent to the material forming the structure. Particularly, as one or more dimensions of a layer is/are reduced below 100 nm, and preferably less than approximately 10 nm, the band gap increases. This band gap shift in turn decreases the wavelength of light emitted if functional layer is used in a light emitting device. The application of quantum confinement structures to intentionally shift the band gap of the layer can be applied to the teachings of the present disclosure, including, but not exclusively, the teachings illustrated by method 900 of FIG. 9 in conjunction with FIGS. 10A-K.

Figure 9:
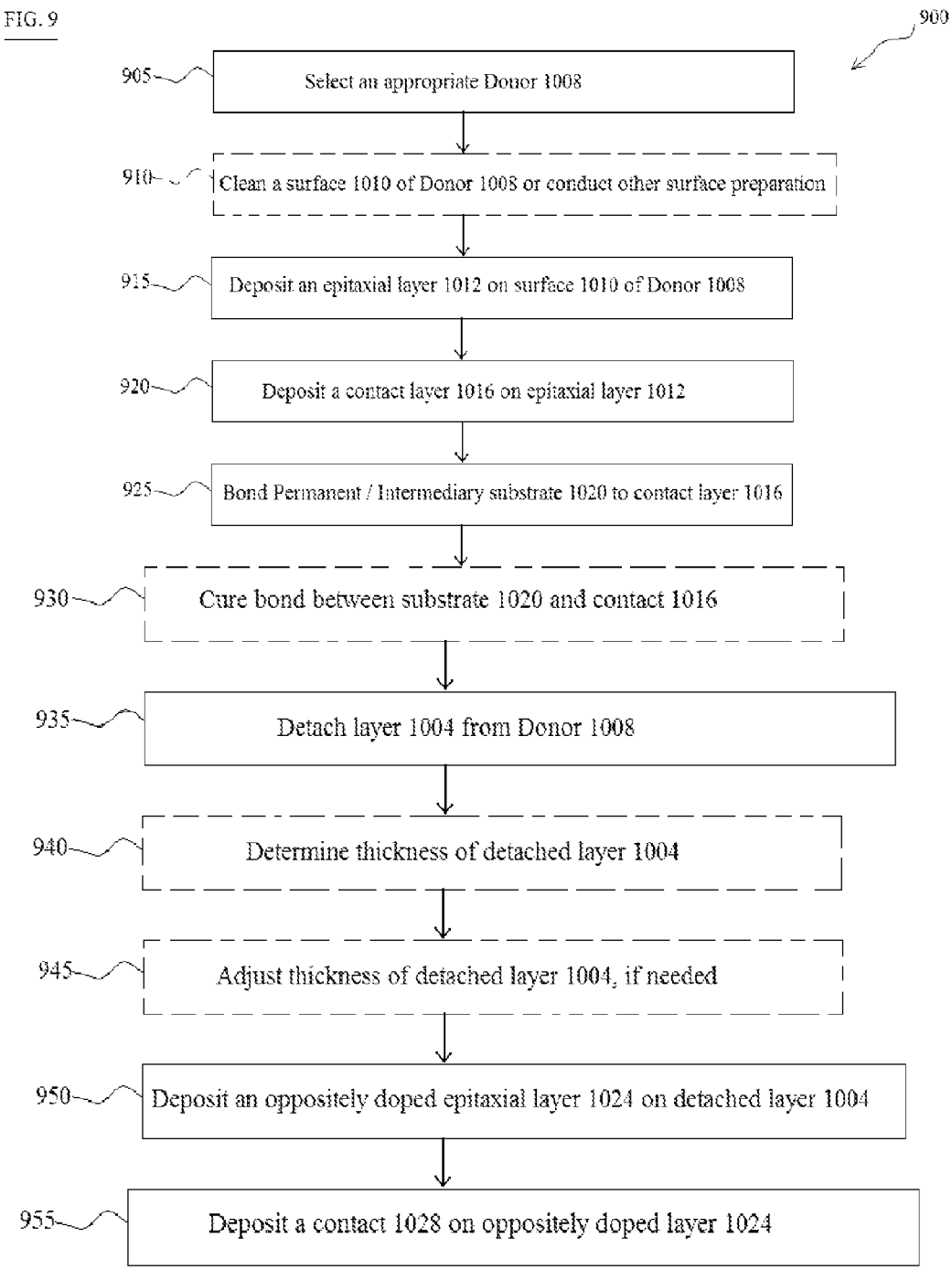
FIG. 9 is a flow diagram of an exemplary method of fabricating an optoelectronic device having a quantum confinement layer.

Referring now to FIGS. 10A-K, and also to FIG. 9, method 900 is directed to fabricating a device 1000 (FIG. 10I) having a quantum confinement layer 1004 (e.g., approximately 100 nm thick or less) made using donated layer techniques disclosed herein. Method 900 begins at step 905, at which a single crystal donor 1008 (FIG. 10A) is selected to provide quantum confinement layer 1004 based, for example, on factors described above. Donor 1008 can be an intrinsic semiconductor or doped to be an n-type or p-type semiconductor. A surface of donor 1008, such as surface 1010, is optionally cleaned at step 910 using, for example, any of the cleaning techniques described above in the context of step 710 of method 700 depicted in FIG. 7.

Figure 10A:
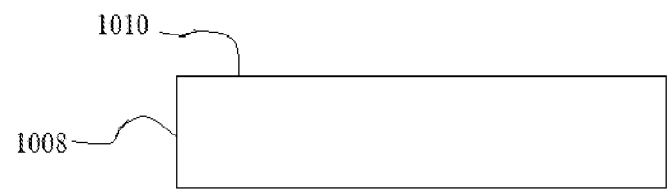
FIGS. 10A-10K illustrate various steps of the method of FIG. 9.
Figure 10B:
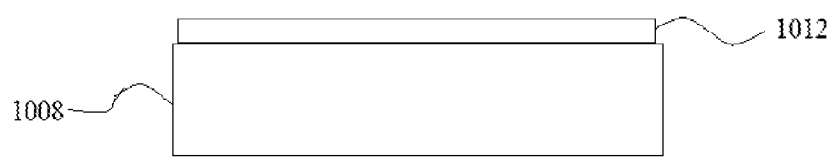

After being selected, and optionally cleaned, at step 915, illustrated by FIG. 10B, a hetero-epitaxial layer 1012 of either the p-type or an n-type is deposited on donor 1008. In some examples, hetero-epitaxial layer 1012 has a band gap greater than the band gap of the lamellar semiconductor (layer 1004). Hetero-epitaxial materials used to fabricate hetero-epitaxial layer 1012 can include, but are not limited to amorphous, nano-crystalline, micro-crystalline, and poly-crystalline phases of Si, Ge, Si (1-x) Ge (x), GaN, GaP, GaAs, InP, InAs, GaAsP, InAsP, GaInP, GaInAs, GaInAsP, ZnS, ZnSe, CdS, CdSe, CdTe, CdSSe, PbSe, PbTe, HgSe, HgTe, PbS, hydrogenated amorphous silicon, AlGaAs, GaSb, InSb, HgCdTe, ZnCdS, ZnCdSe, ZnO, In2O3, SnO2, Ga2O3, CdO, PbO2, InGaZnO, ZnSnO (ZTO), ITO, NIO, ZnInO (ZIO), WO3, cadmium indium antimony oxide, and other multi component amorphous oxides (MAOs).

Figure 10C:
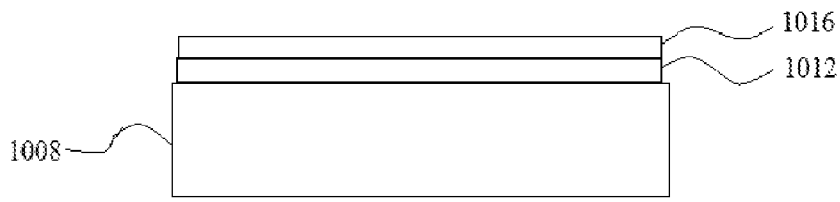
Figure 10D:
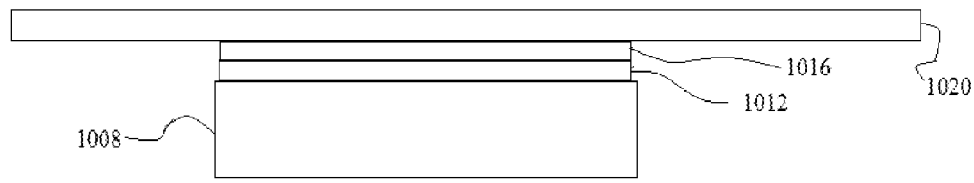
Figure 10E:
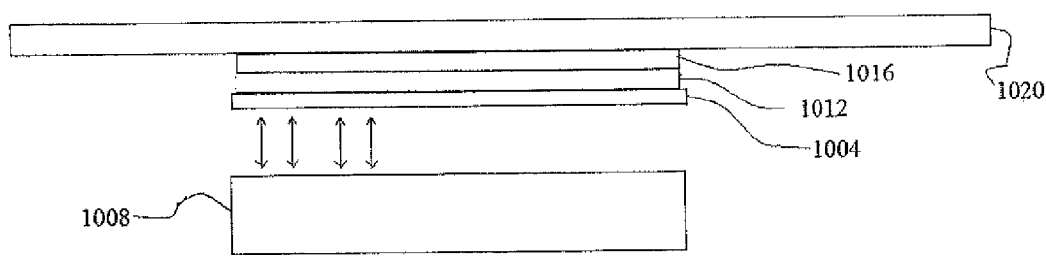
Figure 10F:
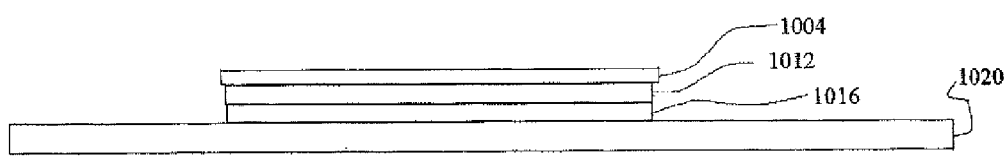

As shown in FIG. 10C, at step 920 a contact 1016 is deposited on hetero-epitaxial layer 1012 in accordance with, for example, techniques discussed above. Also, similar to steps 720, 725, 730 of method 700 of FIG. 7, at steps 925, 930, and 935 of method 900 of FIG. 9 (see also, FIGS. 10D and 10E), substrate 1020 is applied to contact 1016, the assembly is optionally cured to increase the bond between the substrate and contact, and confinement layer 1004 is detached from donor 1008, respectively. As shown in FIG. 10F, the thickness of layer 1004 may optionally be measured at step 940, and optionally augmented or reduced at step 945 using the techniques described above in connection with steps 735 and 740 of method 700 of FIG. 7.

Figure 10G:
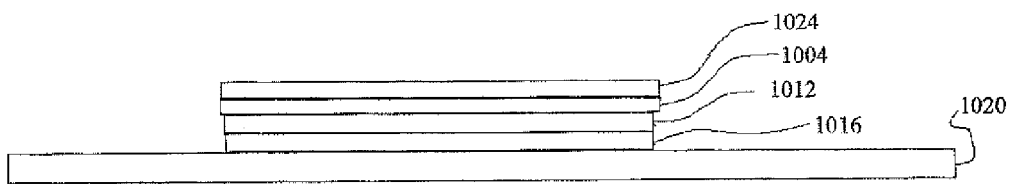
Figure 10H:
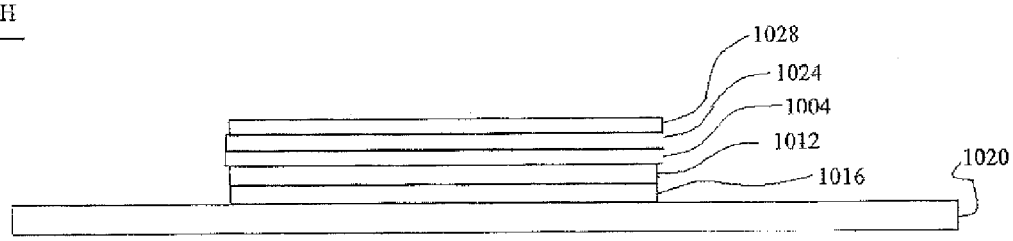
Figure 10I:
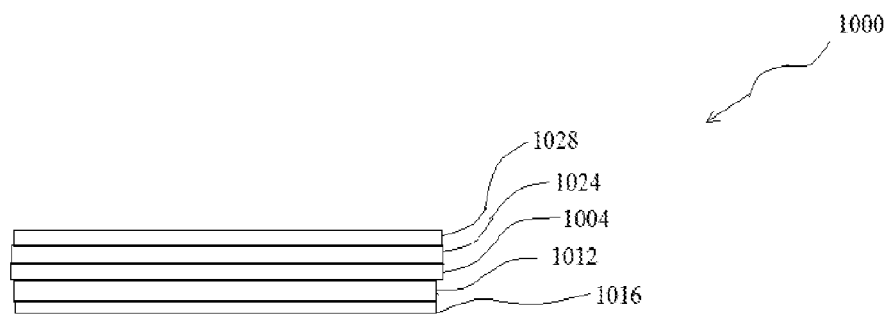

At step 950, illustrated in FIG. 10G, a second heteroepitaxial semiconductor layer 1024 having the opposite doping of layer 1012 is deposited on the remaining free surface of detached layer 1004. As with layer 1012, the band gap of layer 1024 may be greater than the band gap of confinement layer 1004. As with FIGS. 8A 8F, at step 955 (illustrated by FIG. 10H) a second contact 1028 is deposited on the remaining free surface of layer 1024 according to the teachings of the present disclosure. Oppositely doped layer 1024 need not be epitaxially grown at all, and can even be made from an organic, as well as an inorganic, single crystal or non-single crystal, semiconductor material. As with method 700, the above described steps of method 900 need not necessarily be performed in the order presented to achieve an equivalent result.

Another exemplary embodiment is a device similar to the immediately foregoing embodiment, except that detached layer 1004 has a thickness that is too large to act as a quantum confining layer. That is, device 1000 can be prepared according to method 900, and as depicted in FIGS. 9 and 10A-I, except that the thickness of detached layer 1004 is greater than approximately 100 nm. In this embodiment, due to the recombination of electrons and holes from the hetero-epitaxial, detached layer 1004 acts as an electro-luminescent layer instead of a quantum confinement layer.

Figure 10J:
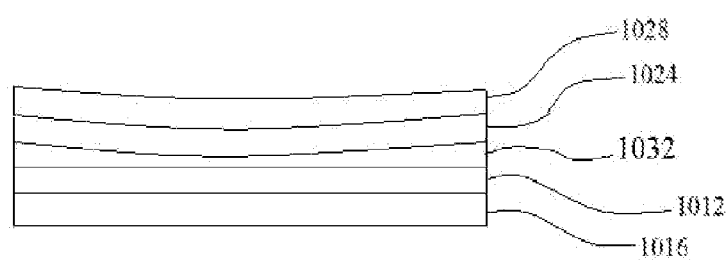
Figure 10K:
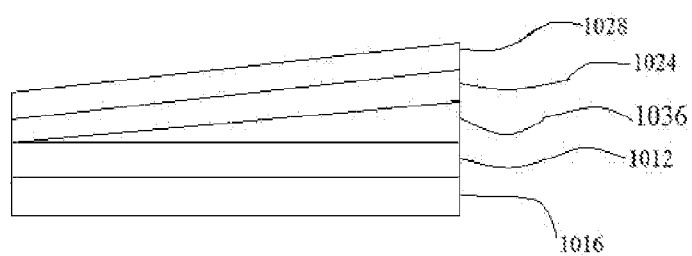

Electro-luminescent embodiments utilizing the forgoing structure and/or made using techniques discussed above, as well as other electro-luminescent structures, can be modified in any number of ways. For example, the color of emitted light can be varied by varying the thickness of the lamellar semiconductor according to the teachings of the present disclosure. The color of the emitted light can be varied because its wavelength is a function of the band gap of the emitting layer. While the band gap is primarily property that is intrinsic to the material, it is also, in part, a function of the thickness of the layer as previously described in the context of FIGS. 4 and 5, and elsewhere in this disclosure. Therefore, the color of emitted light can be tailored through a selection of the semiconductor donor and the thickness of the layer derived therefrom. In fact, the thickness of the detached semiconductor layer need not be uniform. For example, the semiconductor layer can be sloped or stepped using the techniques described above to fabricate a device that emits a plurality of light wavelengths. Furthermore, the sloped or stepped surfaces can be curvilinear or planar. These two examples are illustrated in FIGS. 10J and 10K. As shown, FIG. 10J illustrates a curvilinear layer 1032 that can emit a multitude of light wavelengths by virtue of its non-uniform thickness. Similarly, FIG. 10K illustrates a sloped-planar layer 1036 that can emit a plurality of light waves by virtue of its non-uniform, sloped thickness. Those skilled in the art will appreciate that other embodiments can have thicknesses that vary in other manners and still fall within the teachings disclosed herein. Through proper selection, the device can even emit the requisite wavelengths so that the light appears to the viewer as white light.

Further variations of the foregoing method, and other devices disclosed herein, include depositing quantum dots upon a surface of the semiconductor layer at an interface with a homo- or hetero-epitaxial layer, repeating some of the foregoing steps so as to fabricate an optoelectronic device having multiple quantum confinement layers, fabricating quantum confinement layers that include quantum dots or other nanostructures, including one or more barrier layers adjacent to the quantum confining layer, and embedding the quantum dots within the lamellar semiconductor quantum confinement layer to improve carrier injection into the quantum dots.

Other Devices

While the above discussion has presented lamellar layers, or more generally, layers detached from a suitable donor, in the context of p-n junctions, LEDs, and quantum confinement devices, the broad teachings of the present disclosure can be applied to a wide variety of devices. FIGS. 11-15 present a small selection of the many optoelectronic devices that can be fabricated according to the methods and techniques disclosed herein. Those skilled in the art will appreciate that these devices are generally similar to conventionally fabricated devices except for the inclusion of at least one layer detached from a donor. Because of these similarities, for the sake of brevity, the following examples highlight the use of one or more detached layers in each device, but otherwise simply provide a listing of the elements numerals for the other components.

Figure 11:
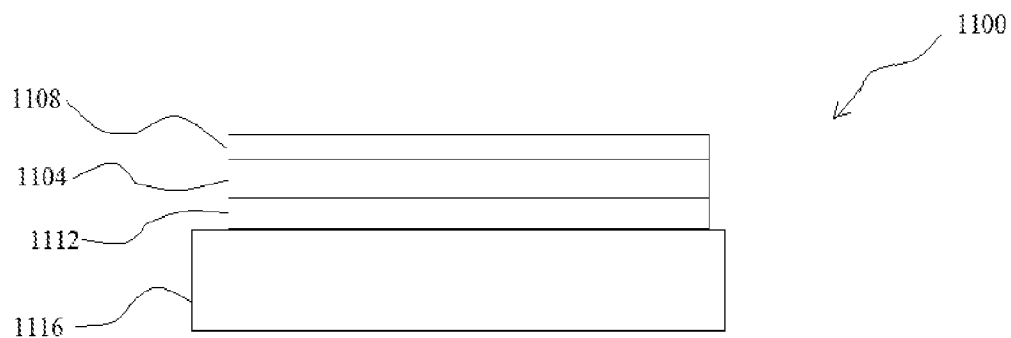
FIGS. 11-17 depict examples of devices made in accordance with the teachings of the present disclosure.

FIG. 11 illustrates a Schottky diode 1100 that includes a detached layer 1104 obtained from a lamellar semiconductor donor (not shown) and incorporated into the diode in accordance with techniques disclosed herein. In this example, detached layer 1104 acts as the semiconductor portion of the semiconductor-metal junction within device 1100. As those skilled in the art will readily appreciate, the components of diode 1100 other than detached layer 1104 can be fabricated using well-known fabrication techniques. For the sake of completeness, following is a list of the components of device 1100 shown.

| | |
|---|---|
| Detached Layer | 1104 |
| Schottky metal contact | 1108 |
| Ohmic Contact | 1112 |
| Substrate | 1116 |

Figure 12:
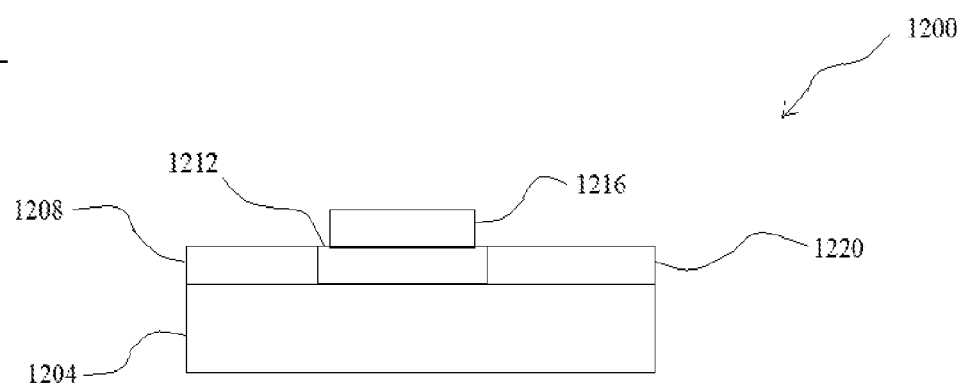

FIG. 12 illustrates a MISFET LED 1200 that includes a detached layer 1204 obtained from a lamellar semiconductor donor (not shown) and incorporated into the LED in accordance with the techniques disclosed herein. In this example, detached layer 1204 functions as a light emitting layer within device 1200. As those skilled in the art will readily appreciate, the components of MISFET LED 1200, other than detached layer 1204, can be fabricated using well-known fabrication techniques. For the sake of completeness, following is a list of the components of device 1200 shown.

| | |
|---|---|
| Detached layer | 1204 |
| Source | 1208 |
| Gate dielectric | 1212 |
| Gate metal | 1216 |
| Drain | 1220 |

Figure 13:
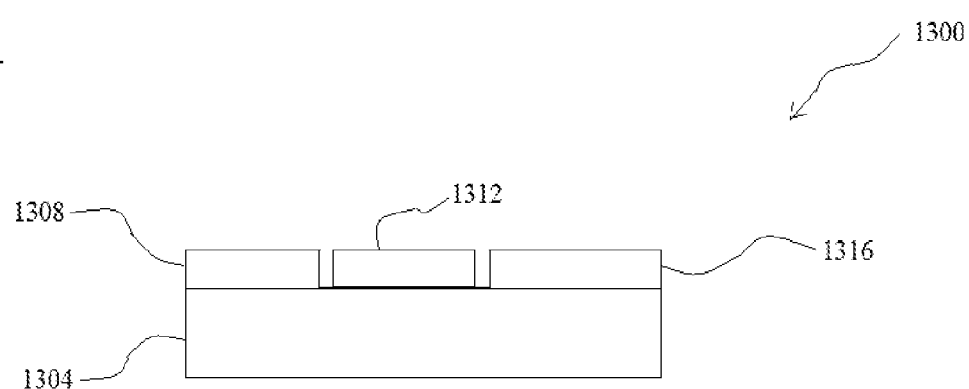

FIG. 13 illustrates a MESFET LED 1300 that includes detached layer 1304 obtained from a lamellar semiconductor donor (not shown) and incorporated into the MESFET LED in accordance with the techniques disclosed herein. In this example, detached layer 1304 functions as a light emitting layer within device 1300. As those skilled in the art will readily appreciate, the components of MESFET LED 1300, other than detached layer 1304, can be fabricated using well-known fabrication techniques. For the sake of completeness, following is a list of the components of device 1300 shown.

| | |
|---|---|
| Detached layer | 1304 |
| Source | 1308 |
| Schottky gate metal | 1312 |
| Drain | 1316 |

Figure 14:
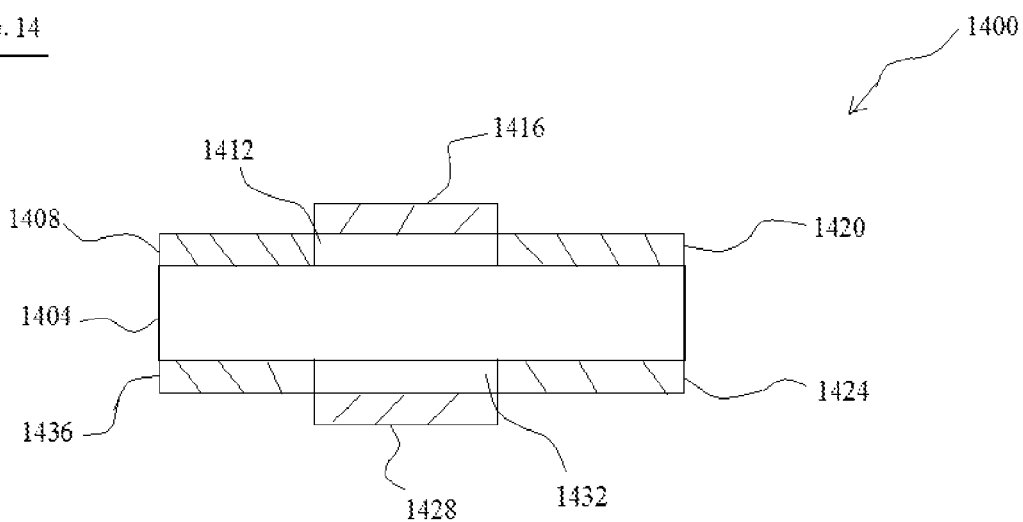

FIG. 14 illustrates a dual MISFET LED 1400 that includes detached layer 1404 obtained from a lamellar semiconductor donor (not shown) and incorporated into the MISFET LED in accordance with the techniques disclosed herein. In this example, detached layer 1404 functions as a light emitting layer within device 1400. As those skilled in the art will readily appreciate, the components of MISFET LED 1400, other than detached layer 1404, can be fabricated using well-known fabrication techniques. For the sake of completeness, following is a list of the components of device 1400 shown.

| | |
|---|---|
| Detached layer | 1404 |
| Source 1 | 1408 |
| Gate dielectric 1 | 1412 |
| Gate 1 | 1416 |
| Drain 1 | 1420 |
| Source 2 | 1424 |
| Gate 2 | 1428 |
| Gate dielectric 2 | 1432 |
| Drain 2 | 1436 |

Figure 15:
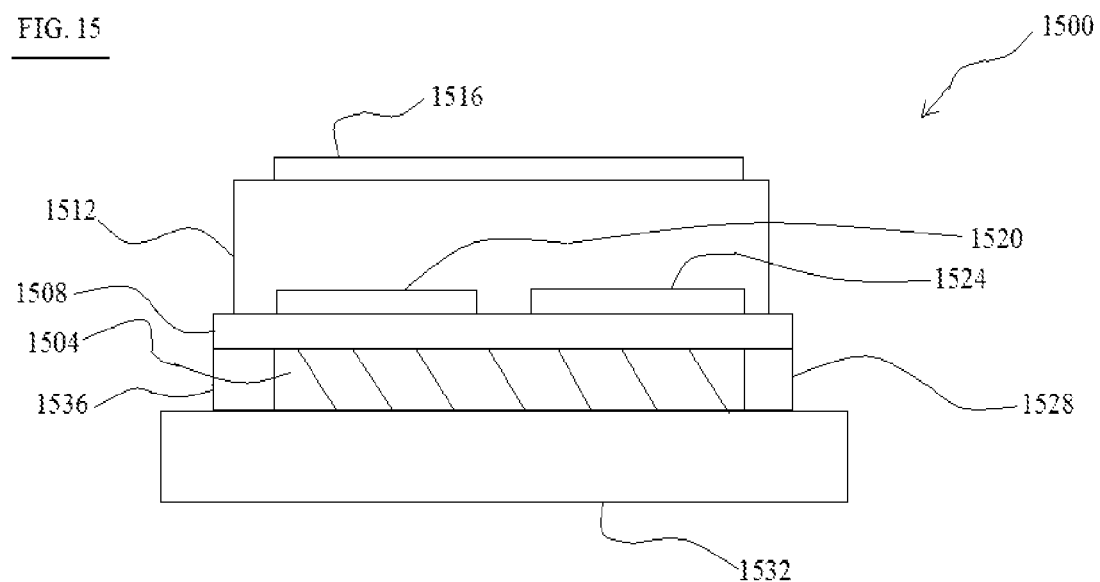

FIG. 15 illustrates an induced p-n junction LED 1500 that includes detached layer 1504 obtained from a lamellar semiconductor donor (not shown) and incorporated into the induced p-n junction-LED in accordance with the techniques disclosed herein. In this example, detached layer 1504 functions as a light emitting layer within device 1500. As those skilled in the art will readily appreciate, the components of induced p-n junction—LED 1500, other than detached layer 1504, can be fabricated using well-known fabrication techniques. For the sake of completeness, following is a list of the components of device 1500 shown.

| | |
|---|---|
| Detached layer | 1504 |
| Sub-gate dielectric layer | 1508 |
| Dielectric | 1512 |
| Common gate | 1516 |
| Gate (voltage 1) | 1520 |
| Gate (voltage 2) | 1524 |
| Ohmic contact 1 | 1528 |
| Dielectric substrate | 1532 |
| Ohmic contact 2 | 1536 |

Figure 16:
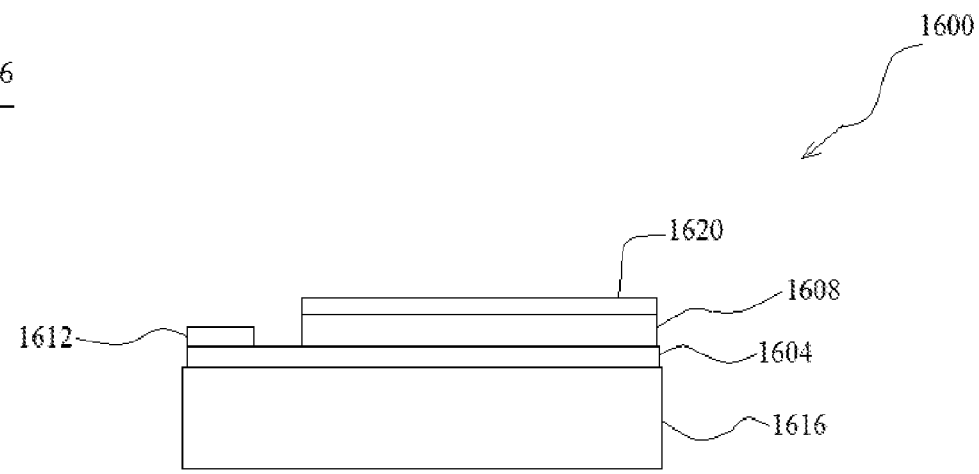

FIG. 16 illustrates a p-n junction LED 1600 that includes a detached layer 1604 obtained from a lamellar semiconductor donor (not shown) and incorporated into the LED in accordance with the techniques disclosed herein. In this example, detached layer 1604 functions as one layer forming the light emitting junction within device 1600. Furthermore, unlike prior examples, this example illustrates an architecture in which the conductive contacts can be on the same side of the device. As those skilled in the art will readily appreciate, the components of p-n junction LED 1600 other than detached layer 1604, can be fabricated using well-known fabrication techniques. For the sake of completeness, following is a list of the components of device 1600 shown.

| | |
|---|---|
| Detached layer | 1604 |
| Oppositely doped layer | 1608 |
| Ohmic Contact | 1612 |
| Dielectric Substrate | 1616 |
| Transparent Ohmic Contact | 1620 |

Figure 17:
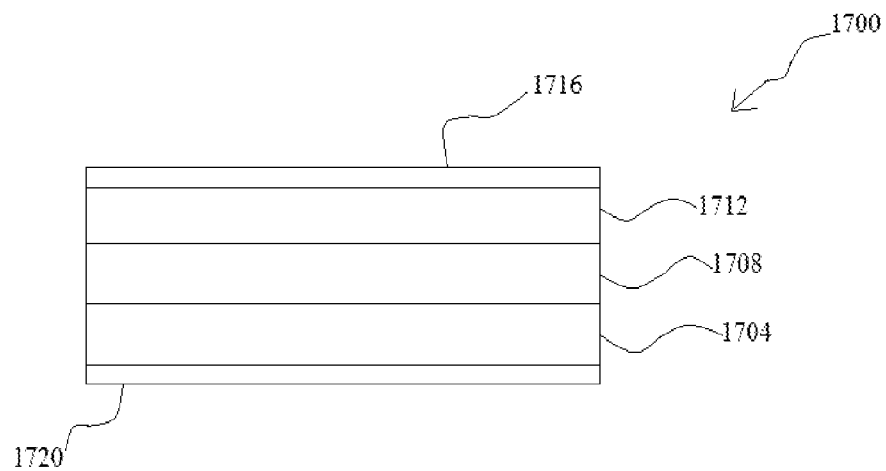

FIG. 17 illustrates a p-n junction LED 1700 that includes a detached layer 1704 obtained from a lamellar semiconductor donor (not shown) and incorporated into the LED in accordance with the techniques disclosed herein. In this example, detached layer 1704 is clearly a functional element within LED 1700, but is not a part of the p-n-junction per se, nor is it a quantum confinement layer. Nevertheless, it is electrically involved with the functioning of LED 1700. As those skilled in the art will readily appreciate, the components of p-n junction LED 1700 other than detached layer 1704, can be fabricated using well-known fabrication techniques. For the sake of completeness, following is a list of the components of LED 1700 shown.

| | |
|---|---|
| Detached layer | 1704 |
| Doped layer | 1708 |
| Oppositely doped layer | 1712 |
| Ohmic Contact | 1716 |
| Ohmic Contact | 1720 |

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of fabricating an optoelectronic device, comprising:
providing a semiconductor donor having a detachable layer;
liberating the detachable layer from the donor; and
incorporating the detached layer into the optoelectronic device as an electrically functional element of the optoelectronic device;
wherein:
said providing the semiconductor donor includes providing an inherently lamellar material, said inherently lamellar material including at least one van der Waals cleavage plane; and
said liberating includes liberating at least one lamella from the semiconductor donor along said at least one van der Waals cleavage plane.

2. A method according to claim 1, wherein said providing an inherently lamellar material includes providing a material comprising gallium and selenium.

3. A method according to claim 1, wherein said inherently lamellar material includes a lamellar material having a bulk band gap greater than or equal to 1.8 eV and less than or equal to 2.5 eV.

4. A method according to claim 1, wherein said inherently lamellar material includes a lamellar material having a bulk band gap greater than or equal to 2.5 eV and less than or equal to 4.5 eV.

5. A method according to claim 1, wherein said providing the semiconductor donor includes providing a semiconductor donor having at least one fabricated lamella.

6. A method according to claim 5, wherein said providing the semiconductor donor having at least one fabricated lamella includes providing a semiconductor donor having a deposited lamella deposited on a substrate, and said liberating includes detaching the deposited lamella from the substrate.

7. A method according to claim 5, wherein said providing the semiconductor donor having at least one fabricated lamella includes providing a semiconductor donor having a plurality of fabricated lamellae defined by planes of weakness resulting from intercalation.

8. A method according to claim 5, wherein said providing the semiconductor donor having at least one fabricated lamella includes providing a semiconductor donor having a plurality of semiconductor-paper layers.

9. A method according to claim 1, wherein the detachable layer has a thickness and the method further comprises tuning the thickness of the detachable layer as a function of desired characteristics of the electrically functional element of the optoelectronic device.

10. A method according to claim 9, wherein said tuning the thickness is performed in conjunction with said liberating.

11. A method according to claim 1, wherein the optoelectronic device has a p-n junction and said incorporating the detachable layer includes incorporating the detachable layer into one side of the p-n junction.

12. A method according to claim 1, wherein the optoelectronic device has a p-n junction and said incorporating the detachable layer includes incorporating the detachable layer into an n-side of the p-n junction and further includes incorporating a second detachable layer into a p-side of the p-n junction.

13. A method according to claim 1, wherein the optoelectronic device has a quantum confinement layer and said incorporating the detachable layer includes incorporating the detached layer into the quantum confinement layer.

14. A method according to claim 1, wherein said providing the semiconductor donor includes providing a crystalline semiconductor donor having a plurality of lamellae, and said liberating the detachable layer from the donor includes liberating a subset of the plurality of lamellae from the crystalline semiconductor donor.

15. A method according to claim 14, wherein said liberating the subset of the plurality of lamellae includes liberating multiple lamellae from the crystalline semiconductor donor.

16. A method according to claim 1, wherein said detachable layer has a first doping type and the method further comprises depositing a first semiconductor layer on a first surface of the detachable layer, wherein the first semiconductor layer has a second doping type opposite the first doping type, thereby forming a p-n junction.

17. A method according to claim 1, further comprising sandwiching the detachable layer between two semiconductor layers, wherein the two semiconductor layers have opposite doping types, and each has a band gap greater than the band gap of the detachable layer.

18. A method according to claim 17, further comprising providing the detachable layer with a thickness less than approximately 100 nm so that the detachable layer functions as a quantum confinement layer within the optoelectronic device.

19. A method according to claim 17, further comprising providing the detachable layer with a thickness greater than approximately 100 nm so that the detachable layer functions as an electroluminescent layer within the optoelectronic device.

20. A method according to claim 17, further comprising providing the detachable layer with a non-uniform thickness, thereby causing the optoelectronic device to emit a plurality of light wavelengths when subjected to a voltage.

21. A method according to claim 20, wherein said non-uniform thickness is curvilinear.

22. A method according to claim 20, wherein said non-uniform thickness is planar.

23. A method according to claim 17, further comprising, before said depositing, adding quantum dots to a surface of the detachable layer.

24. A method according to claim 1, further comprising modifying the band gap of the detachable layer using an intercalant.

25. A method according to claim 1, further comprising modifying the band gap of the detachable layer by exfoliation.

26. A method according to claim 1, wherein said liberating is accomplished using an intercalant.

27. A method of fabricating an optoelectronic device having an electrically functional element, the method comprising:
providing a donor having a crystalline semiconductor layer, wherein the donor includes at least one van der Waals cleavage plane to allow the crystalline semiconductor layer to be liberated therefrom;
liberating the crystalline semiconductor layer from the donor along the at least one van der Waals cleavage plane;
incorporating the crystalline semiconductor layer into the optoelectronic device as the optoelectrically functional element; and
providing the optoelectrically functional element with a predetermined thickness based on the optoelectrical function of the optoelectrically functional element.

28. A method according to claim 27, wherein:
said providing the donor includes depositing the crystalline semiconductor layer onto a reusable crystalline substrate; and
said liberating includes separating the crystalline semiconductor layer from said crystalline substrate along the at least one van der Waals cleavage plane.

29. A method according to claim 27, wherein:
said providing the donor includes providing a donor comprising a plurality of crystalline semiconductor lamellae defined by a plurality of van der Waals cleavage planes; and
said liberating includes separating a subset of said plurality of crystalline semiconductor lamellae along at least one van der Waals cleavage plane of the plurality of van der Waals cleavage planes.

30. A method according to claim 27, wherein said providing the donor includes fabricating the donor to include a plurality of crystalline semiconductor lamella defined by a plurality of van der Waals cleavage planes.

31. A method according to claim 30, wherein said fabricating includes assembling a plurality of crystalline paper layers.

32. A method according to claim 30, wherein said fabricating includes intercalating a precursor to the donor so as to create planes of weakness that define a plurality of crystalline semiconducting lamellae.

33. A method according to claim 27, wherein said providing the at least one optoelectrically functional element with a predetermined thickness is performed as part of said liberating.

34. A method according to claim 27, wherein said providing the at least one optoelectrically functional element with a predetermined thickness includes, after said liberating, adjusting the thickness of the crystalline semiconductor layer.

35. A method according to claim 34, wherein said adjusting the thickness includes removing material from the crystalline semiconductor layer.

36. A method according to claim 34, wherein said adjusting the thickness includes adding material on the crystalline semiconductor layer.

* * * * *